US008946563B2

(12) United States Patent
Kashiwagi et al.

(10) Patent No.: US 8,946,563 B2
(45) Date of Patent: Feb. 3, 2015

(54) MODULE WITH EXPOSED PARTS OF COPPER FOIL AND PROCESS FOR PRODUCTION THEREOF

(75) Inventors: Takafumi Kashiwagi, Osaka (JP); Yukio Sakai, Osaka (JP); Nobuhiro Tada, Osaka (JP); Takayuki Hiruma, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 257 days.

(21) Appl. No.: 13/496,907

(22) PCT Filed: Sep. 30, 2010

(86) PCT No.: PCT/JP2010/005888
§ 371 (c)(1),
(2), (4) Date: Mar. 19, 2012

(87) PCT Pub. No.: WO2011/040030
PCT Pub. Date: Apr. 7, 2011

(65) Prior Publication Data
US 2012/0168214 A1    Jul. 5, 2012

(30) Foreign Application Priority Data

| Oct. 1, 2009 | (JP) | 2009-229433 |
| Feb. 1, 2010 | (JP) | 2010-020042 |
| Feb. 1, 2010 | (JP) | 2010-020043 |
| Feb. 1, 2010 | (JP) | 2010-020044 |
| Feb. 1, 2010 | (JP) | 2010-020045 |

(51) Int. Cl.
*H05K 1/16* (2006.01)
*H05K 3/28* (2006.01)
(Continued)

(52) U.S. Cl.
CPC ............ *H05K 3/284* (2013.01); *H01L 23/3121* (2013.01); *H01L 23/552* (2013.01);
(Continued)

(58) Field of Classification Search
USPC .................................. 174/260, 250, 255–258
See application file for complete search history.

(56) References Cited

U.S. PATENT DOCUMENTS

2006/0022339 A1* 2/2006 Matsunami ................... 257/738
2010/0157545 A1 6/2010 Lehtimaki et al.

FOREIGN PATENT DOCUMENTS

| JP | 06326476 A | 11/1994 |
| JP | 11-163583 A | 6/1999 |

(Continued)

OTHER PUBLICATIONS

Takase et al. (Machine Translation of Japanese Patent Publication No. 2005-109306), Publication Date: Apr. 21, 2005.*

(Continued)

*Primary Examiner* — Tremesha S Willis
(74) *Attorney, Agent, or Firm* — RatnerPrestia

(57) ABSTRACT

A module including a circuit board including an insulating layer and one or more layers of copper foil embedded in the insulating layer; an electronic component mounted on the circuit board; a sealing part sealing the electronic component on the circuit board; and a metal film covering side surfaces of the circuit board and surfaces of the sealing part. A part of the copper foil is exposed to the side surfaces of the circuit board, an exposed part of the copper foil has a width of less than 200 μm, and the copper foil and the metal film are electrically coupled to each other through the exposed part. Thus, occurrence of blushing, crack, or the like, can be prevented.

11 Claims, 20 Drawing Sheets

(51) Int. Cl.
   *H01L 23/31*    (2006.01)
   *H01L 23/552*   (2006.01)
   *H01L 25/065*   (2006.01)
   *H01L 23/00*    (2006.01)
   *H05K 1/02*     (2006.01)

(52) U.S. Cl.
   CPC ............ H01L25/0655 (2013.01); H01L 24/97 (2013.01); *H01L 2924/01078* (2013.01); *H01L 2924/19041* (2013.01); *H01L 2924/3025* (2013.01); *H05K 1/0218* (2013.01); *H05K 2201/0715* (2013.01); *H05K 2201/0723* (2013.01); *H05K 2201/0919* (2013.01); *H05K 2201/09309* (2013.01); *H05K 2203/1316* (2013.01); *H01L 2924/01019* (2013.01); *H01L 2224/16225* (2013.01); *H01L 2224/97* (2013.01); *H01L 2924/1531* (2013.01); *H01L 2924/01029* (2013.01); *H01L 2924/19105* (2013.01)

USPC ........................................................ 174/260

(56) References Cited

FOREIGN PATENT DOCUMENTS

| | | |
|---|---|---|
| JP | 11177247 A | 7/1999 |
| JP | 2001-244688 A | 9/2001 |
| JP | 2003218541 A | 7/2003 |
| JP | 2004172176 A | 6/2004 |
| JP | 2005268448 A | 9/2005 |
| JP | 2005276980 A | 10/2005 |
| JP | 2006286915 A | 10/2006 |
| JP | 2006339270 A | 12/2006 |
| WO | WO 2008/145804 | 12/2008 |

OTHER PUBLICATIONS

International Application Serial No. PCT/JP2010/005888, International Search Report mailed Dec. 14, 2010, 8 pgs.

\* cited by examiner

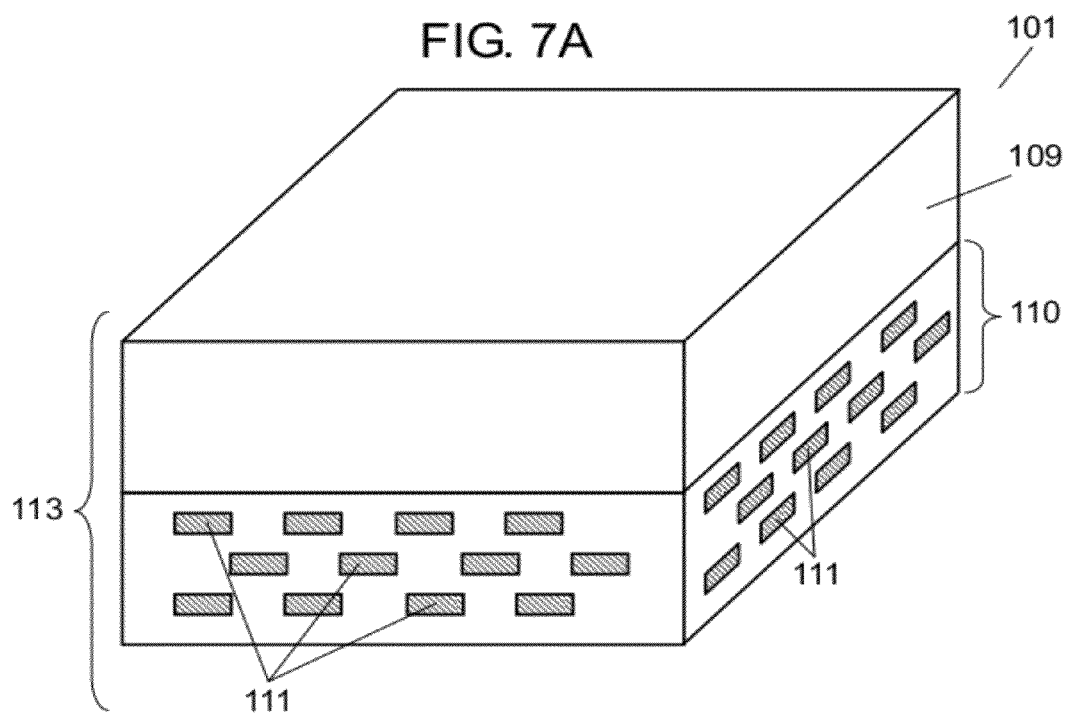
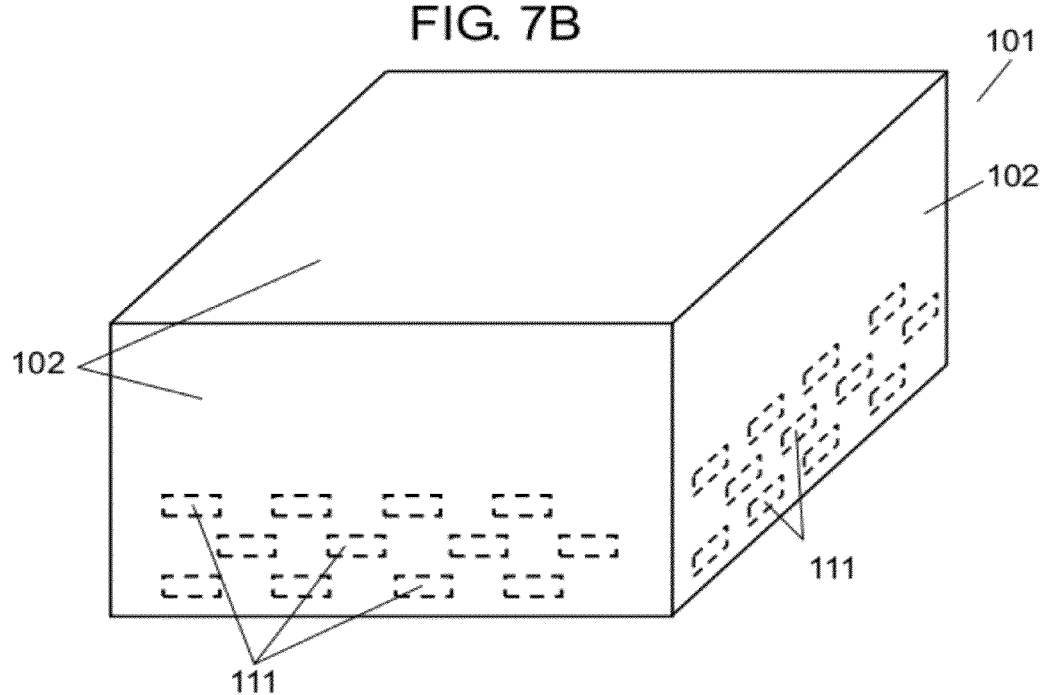

… (US 8,946,563 B2)

MODULE WITH EXPOSED PARTS OF COPPER FOIL AND PROCESS FOR PRODUCTION THEREOF

TECHNICAL FIELD

The present invention relates to a module formed with resin by molding and a process for production thereof.

BACKGROUND ART

A conventional module is described with reference to FIGS. 19A and 19B.

FIGS. 19A and 19B are sectional views of a conventional module. In FIGS. 19A and 19B, conventional module 1 includes circuit board 4, components 6 such as a semiconductor chip, a laminated ceramic capacitor, and a square chip resistor mounted on circuit board 4, and sealing part 3 made of an epoxy resin for sealing thereof. Furthermore, metal film 2 of a metal paste and the like is formed thereon.

Circuit board 4 includes wiring (not shown) including a copper foil pattern provided on a surface layer or an inner layer thereof, ground layer 5 including a copper foil pattern for shielding, and epoxy layer 7 for connecting thereof. Epoxy layer 7 is an interlayer insulating layer formed by impregnating glass woven fabric and the like with an epoxy resin.

In FIGS. 19A and 19B, metal film 2 is provided for shielding, and connected to epoxy layer 7 and ground layer 5 exposed to the wall surface thereof, which constitute circuit board 4.

In FIG. 19B, peeled portion 8 occurs in the vicinity of a connection portion between metal film 2 and ground layer 5. Peeled portion 8 is a peeled portion (which is also referred to as a "void portion") occurring in an interface portion between epoxy layer 7 and ground layer 5 when circuit board 4 is cut. Since peeled portion 8 looks white in observation under a microscope and the like, it may be also referred to as a whitened part.

FIG. 20 is a side view illustrating a peeled portion of a conventional module. The peeled portion is described in detail with reference to FIG. 20. FIG. 20 corresponds to a side view of module 1 before metal film 2 made of conductive paste and the like is formed on a surface thereof.

As shown in FIG. 20, it is shown that peeled portions 8a and 8b occur in the interface between ground layer 5 exposed to the side surface of circuit board 4 and epoxy layer 7 that is brought into contact with ground layer 5.

Such peeled portions 8a and 8b easily occur on a cut surface of circuit board 4 when one circuit board 4 is divided into a plurality of units by, for example, dicing.

Circuit board 4 in which such peeled portions 8a and 8b occur may affect reliability. Even if metal film 2 is provided on peeled portions 8a and 8b once occurred, it is difficult to bond again the interface between epoxy layer 7 and ground layer 5 which are once separated. Since FIG. 20 shows a state before metal film 2 is formed, metal film 2 is not shown.

When a sealing structure (not shown) provided by mounting a plurality of components 6 on one large circuit board and sealing it with sealing part 3 is divided into a plurality of pieces by, for example, dicing so as to form module component 1, peeled portions 8a and 8b easily occur. This is because when separate members, that is, sealing part 3 and circuit board 4, are divided and cut simultaneously, a stress easily concentrates on peeled portions 8a and 8b. That is to say, in conventional circuit board 4, when ground layer 5 is exposed to an end surface (or a cut surface) of circuit board 4, interfacial peeling such as peeled portion 8 may occur in the interface between ground layer 5 and epoxy layer 7 adjacent to ground layer 5.

As the prior art document regarding this invention, the following Patent Literature 1 is known.

CITATION LIST

Patent Literature

PTL 1: Japanese Patent Unexamined Publication No. 2006-286915

SUMMARY OF THE INVENTION

A module of the present invention includes a circuit board including an insulating layer and copper foil embedded in the insulating layer; an electronic component mounted on the circuit board; a sealing part sealing the electronic component; and a metal film covering a side surface of the circuit board and a surface of the sealing part. A part of the copper foil is exposed to the circuit board. An exposed part of the copper foil has a width of less than 200 μm. The copper foil and the metal film are electrically coupled to each other through the exposed part. With this configuration, the module of the present invention can enhance reliability and a shielding effect.

Furthermore, in the module of the present invention, a plurality of electronic components are mounted on one circuit board, and covered with a sealing part including a sealing resin to form a large sealing structure, from which a plurality of small divided units can be formed. Since peeling does not easily occur in an interface between the copper foil and the insulating layer during dividing, electrical connection reliability of the module can be improved.

BRIEF DESCRIPTION OF DRAWINGS

FIG. 7A is a perspective view showing the module before a metal film is formed in accordance with the first exemplary embodiment of the present invention.

FIG. 7B is a perspective view showing the module after a metal film is formed in accordance with the first exemplary embodiment of the present invention.

DESCRIPTION OF EMBODIMENTS

First Exemplary Embodiment

Figure 1:
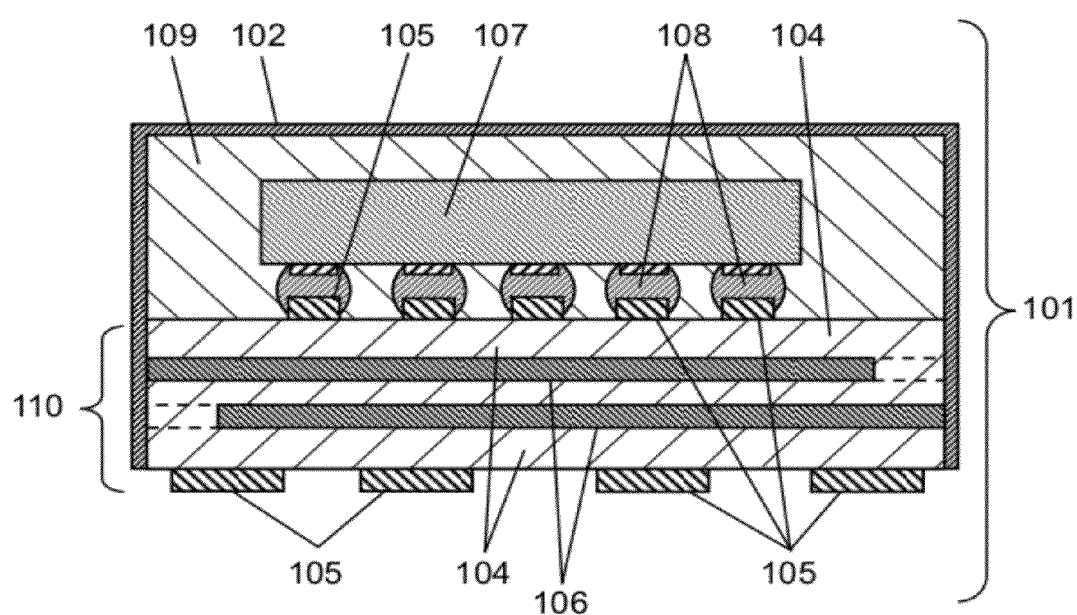
FIG. 1 is a sectional view of a module in accordance with a first exemplary embodiment of the present invention.

Hereinafter, a module in accordance with a first exemplary embodiment of the present invention is described with reference to drawings. FIG. 1 is a sectional view of the module in accordance with the first exemplary embodiment of the present invention.

As shown in FIG. 1, circuit board 110 includes wiring 105 provided on the outermost layer, wiring provided on the inner layer (the wiring provided on the inner layer is not shown), and copper foil 106 (a ground layer).

Electronic component 107 such as a semiconductor chip, a laminated ceramic capacitor, and a square chip resistor is mounted on wiring 105 via mount part 108 such as solder. Note here that a mounting method of mount part 108 is not limited to solder.

By covering electronic component .107 with sealing part 109 made of, for example, an epoxy resin to which ceramic filler and the like is added, reliability of electronic component 107 is enhanced.

FIG. 1 schematically shows a state in which a plurality of layers of copper foil 106 are connected to metal film 102 in a staggered state (that is, alternately shifted state) on the side surfaces of circuit board 110.

As epoxy layer 104 (insulating layer 104), glass fiber (for example, a glass woven fabric and a glass non-woven fabric), which is impregnated with an epoxy resin and hardened, can be used. Alternatively, aramid fiber (for example, an aramid woven fabric or an aramid non-woven fabric), which is impregnated with an epoxy resin and hardened, can be used. Circuit board 110 includes one or more layers of copper foil 106 embedded in epoxy layer 104.

As sealing part 109, a sealing material including, for example, an epoxy resin to which inorganic filler and the like is added is used. In FIG. 1, a projected area (or a floor area) of sealing part 109 is made to be substantially the same as that of circuit board 110, but the configuration is not necessarily limited to this.

For example, when circuit board 110 is an interposer, the projected area of circuit board 110 may be smaller than that of sealing part 109. Electronic component 107, which is assumed to be a semiconductor element like CPU, may be bare chip mounted on circuit board 110 as an interposer, followed by dropping a liquid sealing resin (also referred to as a "potting resin") onto the semiconductor element.

As copper foil 106, electrolytic copper or rolled copper is used. By selecting the thickness of copper foil 106 from, for example, 12 μm, 18 μm, and 36 μm, an exposed part from circuit board 110 (for example, a width of exposed part 111 in FIG. 2 mentioned below) can be easily processed into less than 200 μm.

Note here that for the purpose of preventing copper from rusting, it is useful to add metal materials such as Ni and Z to metal film 102 or to form metal film 102 of an alloy of the metal materials. Furthermore, it is useful that metal film 102 is formed of a plurality of layers. In this case, it is desirable that a metal material such as Ni having an excellent antirust property be used for the outermost layer. It is desirable that the inner layer side of metal film 102 mainly contain copper. This is because it is useful to reduce connection resistance with respect to the exposed part of copper foil 106 from circuit board 110. This is because copper has low electrical resistance, and has excellent shielding properties (EMI and EMC). Furthermore, when titanium and the like is used on the inner layer side of metal film 102, adhesiveness between metal film 102 and circuit board 110 or epoxy layer 104 can be enhanced. Note here that a method for forming metal film 102 is described later with reference to FIGS. 6A and 6B.

Next, a shape of exposed part 111 provided by exposing a part of copper foil 106 embedded in circuit board 110 constituting module 101, which is a feature of the present application, is described with reference to FIG. 2.

Figure 2:
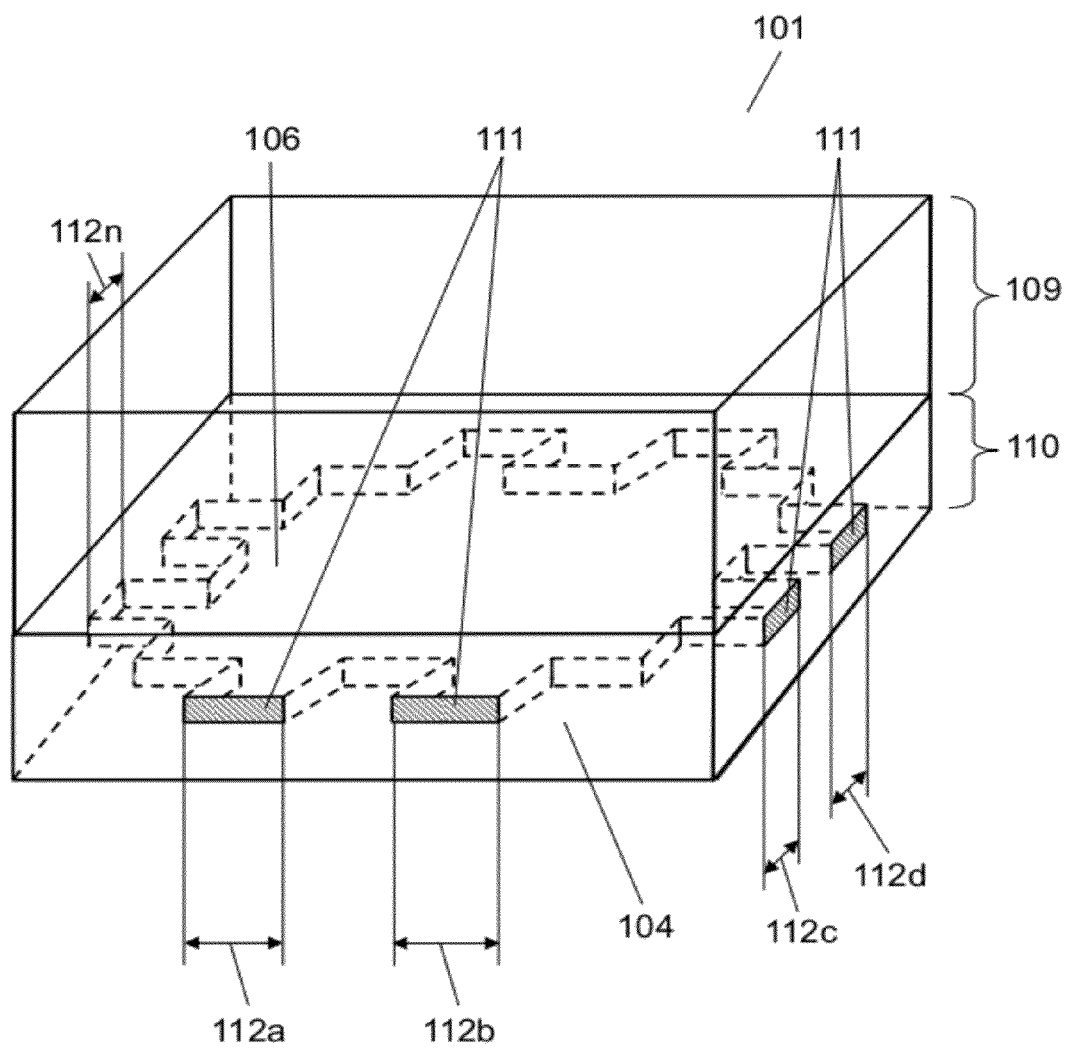
FIG. 2 is a perspective view illustrating an exposed part provided on the side surface of a circuit board of the module in accordance with the first exemplary embodiment of the present invention.

FIG. 2 is a perspective view illustrating exposed parts 111 provided on the side surfaces of the circuit board of module 101 in accordance with the first exemplary embodiment of the present invention. Exposed parts 111 are provided by exposing a part of copper foil 106 embedded in circuit board 110 to the side surfaces of circuit board 110. Widths of exposed parts 111 are denoted by arrows 112a, 112b, 112c, . . . , 112n (n is an integer), respectively. In FIG. 2, exposed parts 111 are numbered counterclockwise.

Figure 19A:
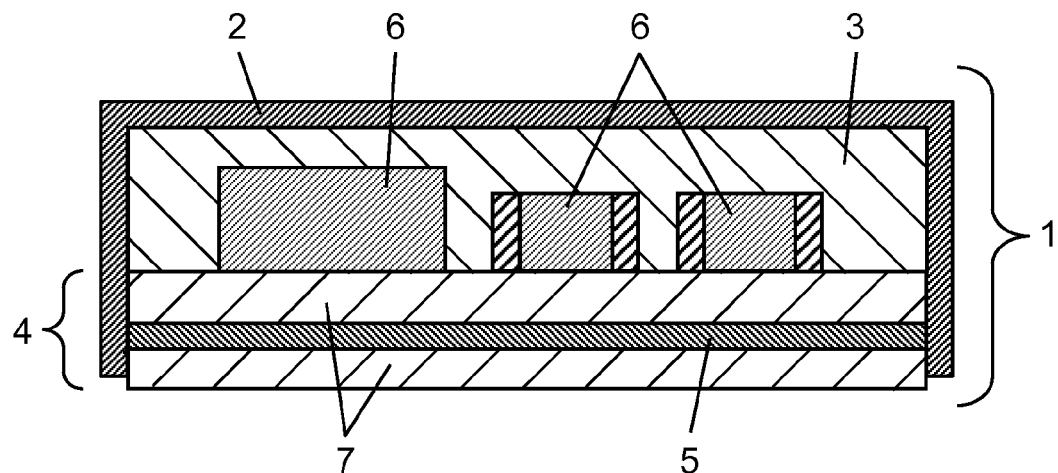
FIG. 19A is a sectional view of a conventional module.
Figure 19B:
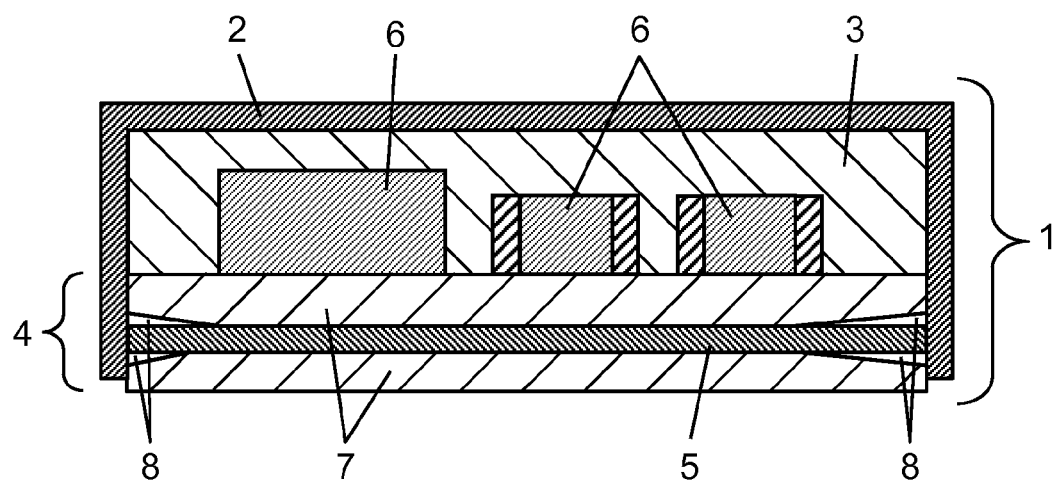
FIG. 19B is a sectional view of a conventional module.
Figure 20:
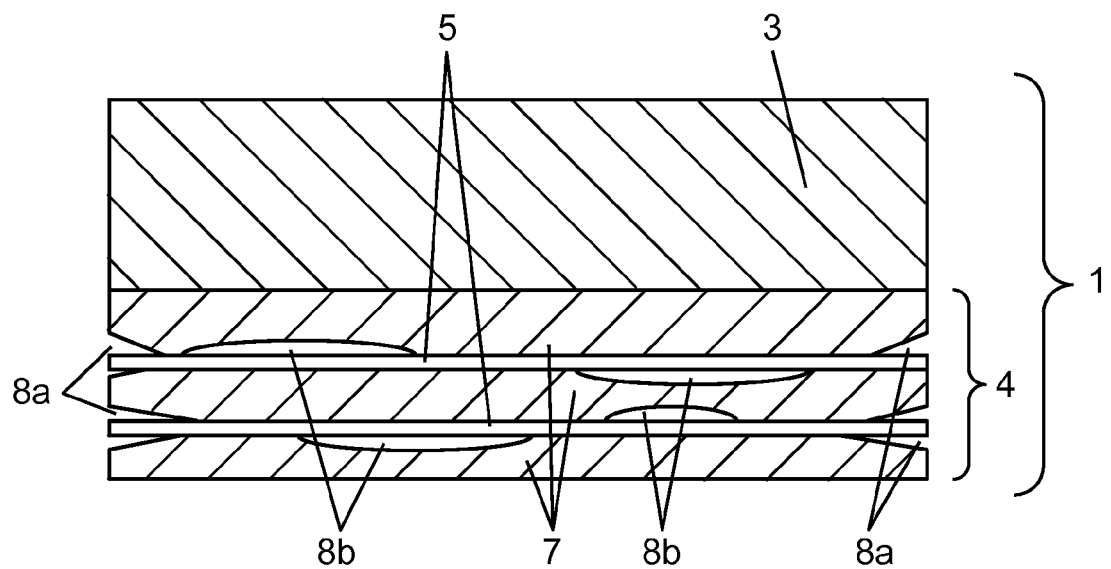
FIG. 20 is a side view illustrating a peeled portion of a conventional module.

It is desirable that each of the widths of exposed parts 111 (portions shown by arrows 112a, 112b, 112n, etc.) on the side surfaces of circuit board 110 be not less than the thickness of copper foil 106 and less than 200 µm. When the width of exposed part 111 is more than 200 µm, peeled portions 8, 8a, and 8b described in FIGS. 19A and 19B and FIG. 20 may occur. When the width of exposed part 111 is less than the thickness of copper foil 106, processing may be difficult. Note here that when a plurality of exposed parts 111 are provided adjacent to each other on the same plane, it is desirable that the plurality of exposed parts 111 be separated from each other with a distance that is not less than the thickness of copper foil 106 to be used.

In FIG. 2, epoxy layer 104 constituting circuit board 110 embeds one or more layers of copper foil 106. Then, exposed parts 111 are provided in the periphery (for example, two or more sides, furthermore, three or more sides, and further desirably all of the four sides in the four sides) of copper foil 106. Exposed part 111 is a part of a ground pattern including copper foil 106 embedded in circuit board 110, which is exposed to the side surface of circuit board 110 by cutting (for example, dicing). All of top, bottom, left and right parts of exposed part 111 are covered with epoxy layer 104. Thus, on the side surfaces of the top, bottom, left and right of exposed part 111, an adhesion force between exposed part 111 and metal film 102 can be enhanced. Furthermore, the width of exposed part 111 is made to be less than 200 µm (furthermore, 150 µm or less, and 100 µm or less depending upon applications). Thus, an adhesion area (or the ratio) of copper foil 106 and epoxy layer 104 in the top, bottom, left and right side surfaces of exposed part 111 can be relatively increased with respect to an exposed area of exposed part 111. Note here that the height (or thickness) of exposed part 111 is determined depending upon the thickness of copper foil 106 constituting exposed part 111.

In FIG. 2, the total of the widths of individual exposed parts 111 is defined as ground connection total length L. That is to say, ground connection total length L is defined as (width represented by arrow 112a)+(width represented by arrow 112b)+(width represented by arrow 112c)+(width represented by arrow 112d)+ . . . +(width represented by arrow 112n)=(ground connection total length L). Herein, n is an integer, for example, 1, 2, 3, . . . .

Figure 3:
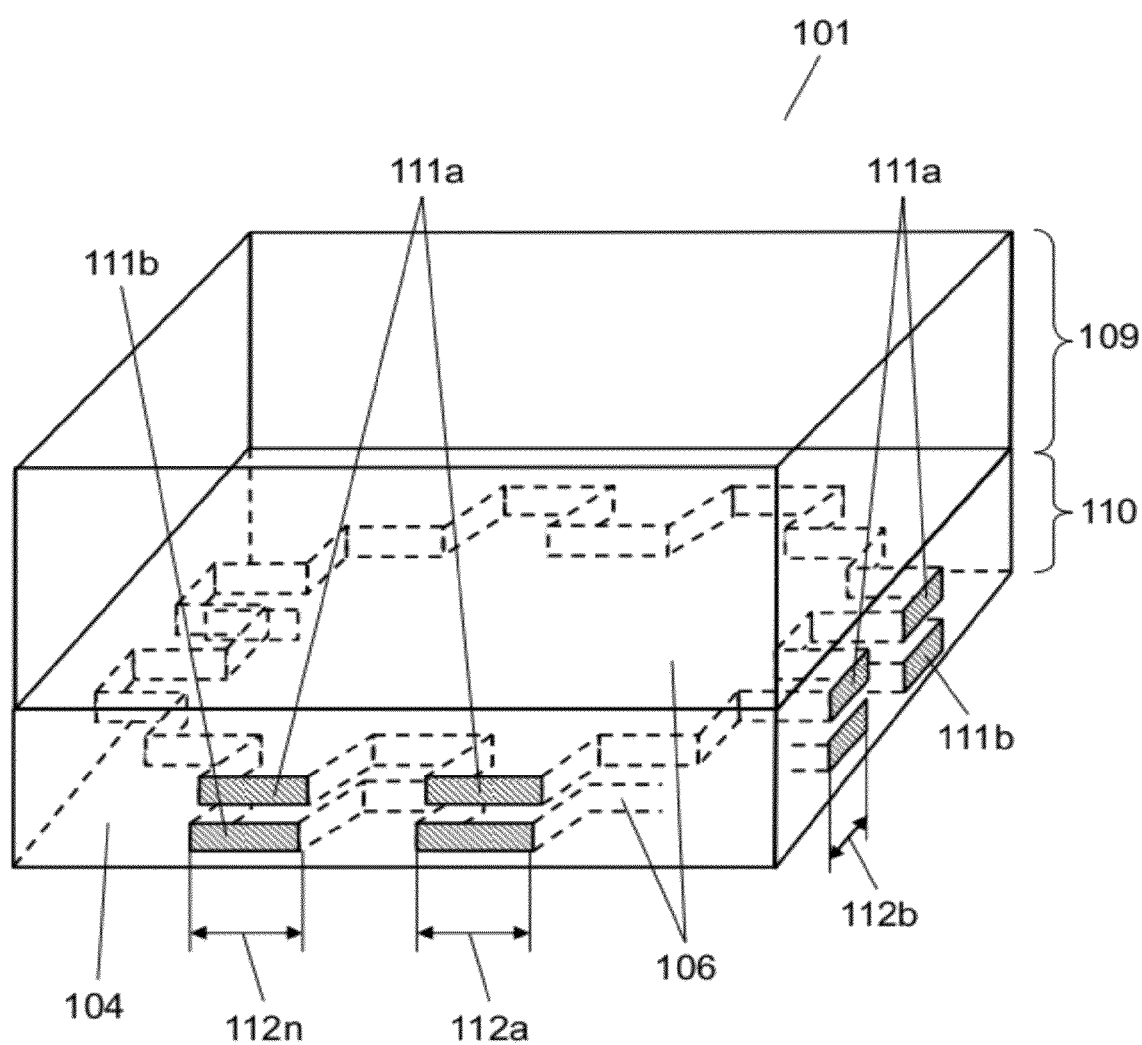
FIG. 3 is a perspective view illustrating a plurality of layers of exposed parts provided on the side surfaces of the circuit board of the module in accordance with the first exemplary embodiment of the present invention.

FIG. 3 is a perspective view illustrating a plurality of layers of exposed parts provided on the side surfaces of the circuit board of the module in accordance with the first exemplary embodiment of the present invention.

In FIG. 3, a plurality of layers of copper foil 106 are provided in such a manner that they are overlapped onto each other. Exposed part 111a denotes exposed part 111 of copper foil 106 in epoxy layer 104 in the second layer, and exposed part 111b denotes exposed part 111 of copper foil 106 in epoxy layer 104 in the first layer.

It is useful to provide wiring 105 among a plurality of laminated layers of copper foil 106 via epoxy layers 104. As shown in FIG. 3, by providing a plurality of layers of copper foil 106 as the ground pattern, electric connection portions to metal film 102 through exposed part 111 can be increased. Therefore, a shielding effect can be further enhanced.

Figure 4:
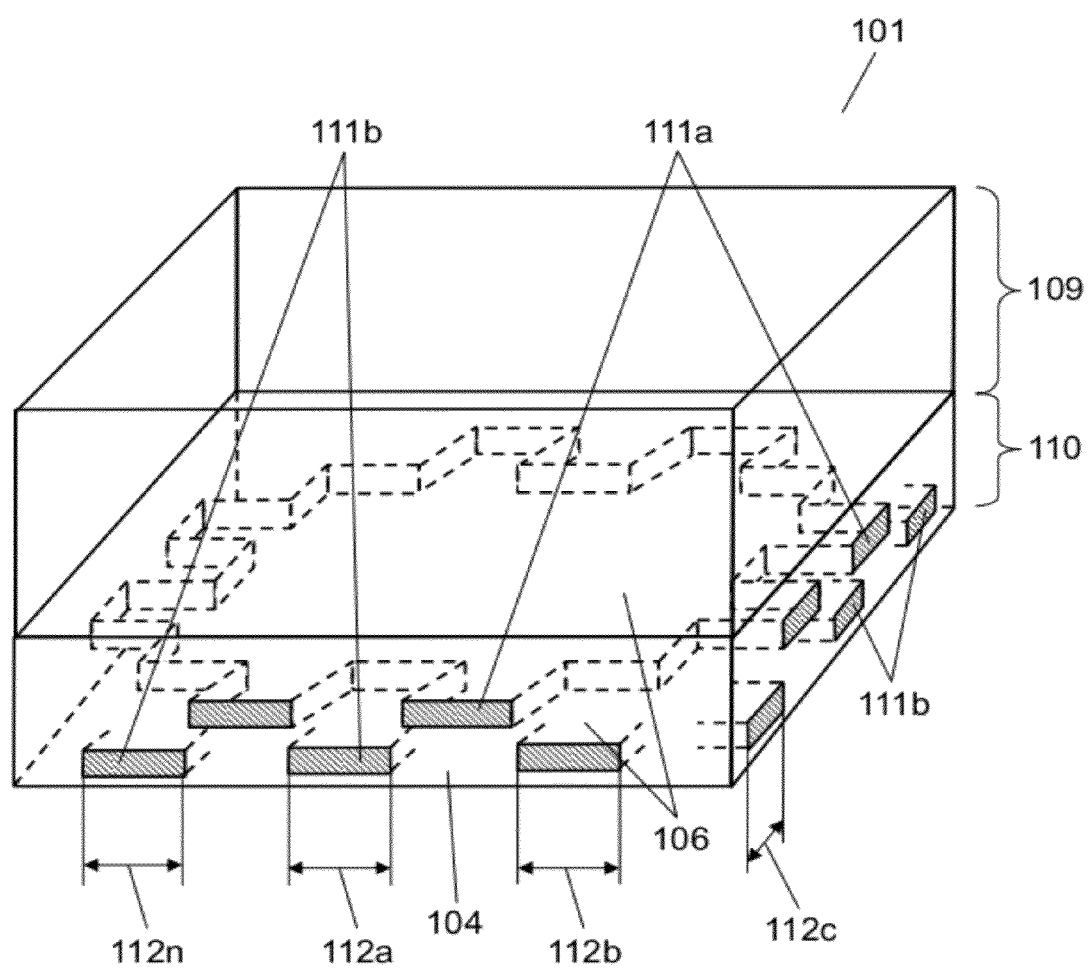
FIG. 4 is a perspective view illustrating a plurality of layers of exposed parts provided on the side surfaces of the circuit board of the module in accordance with the first exemplary embodiment of the present invention.

FIG. 4 is a perspective view illustrating a plurality of layers of exposed parts provided on the side surfaces of the circuit board of the module in accordance with the first exemplary embodiment of the present invention. FIG. 4 shows a state in which the plurality of layers of copper foil 106 are provided in such a manner that exposed parts 111 thereof are not completely overlapped. By laminating exposed parts 111 such that they are not completely overlapped, that is, they are shifted from each other, it is possible to reduce electromagnetic waves leaking in a space between exposed part 111a and exposed part 111b. Note here that a state in which exposed part 111a and exposed part 111b are arranged in such a manner that a part thereof is not overlapped is referred to as a staggered state. However, unlike checker patterns, exposed part 111a and exposed part 111b are arranged in such a manner that they are not completely overlapped on each other. A state in which exposed part 111a and exposed part 111b are partially overlapped on each other is also included in the staggered state, and an effect of reducing leakage of electromagnetic waves can be obtained.

As shown in FIG. 4, when exposed parts 111 are arranged in a staggered state, it is possible to obtain an effect of reducing leakage of noise in spaces between copper foil 106 and metal film 102 that is connected to copper foil 106, between exposed part 111a and metal film 102, as well as between exposed part 111b and metal film 102, respectively. Note here that FIG. 4 is a schematic view, and exposed part 111a and exposed part 111b may be partially overlapped with respect to each other.

Next, an example of a process for production of module 101 is described with reference to FIGS. 5A, 5B, 6A, and 6B.

FIGS. 5A, 5B, 6A, and 6B are sectional views illustrating a process for production of module 101 in accordance with the first exemplary embodiment of the present invention. A state, with partially enlarged, in which electronic component 107 is mounted is described with reference to FIGS. 5A, 5B, 6A, and 6B.

Figure 5A:
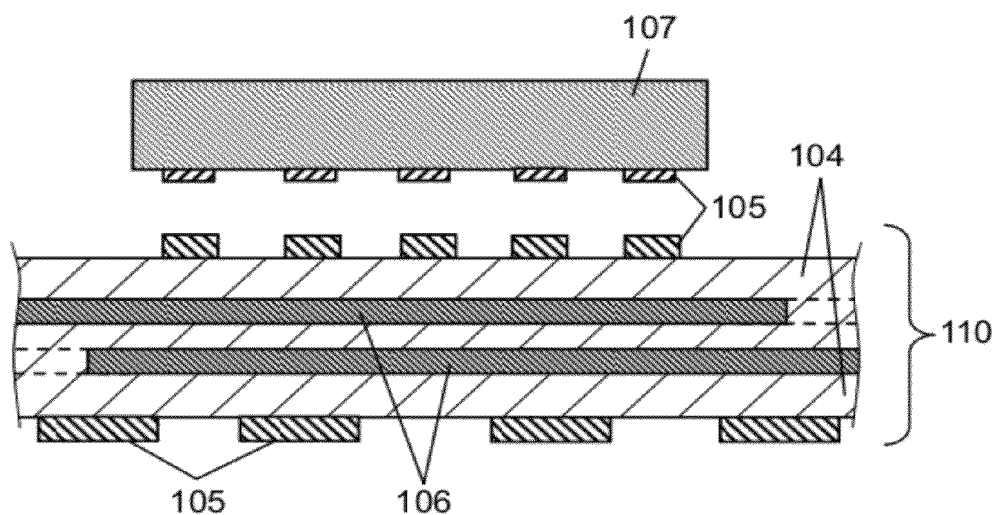
FIG. 5A is a sectional view illustrating a process for production of the module in accordance with the first exemplary embodiment of the present invention.

As shown in FIG. 5A, electronic component 107 is mounted on circuit board 110. Note here that it is useful to mount a plurality of electronic components 107 on one large circuit board 110, and then the circuit board is cut into a plurality of modules 101 (not shown).

Figure 5B:
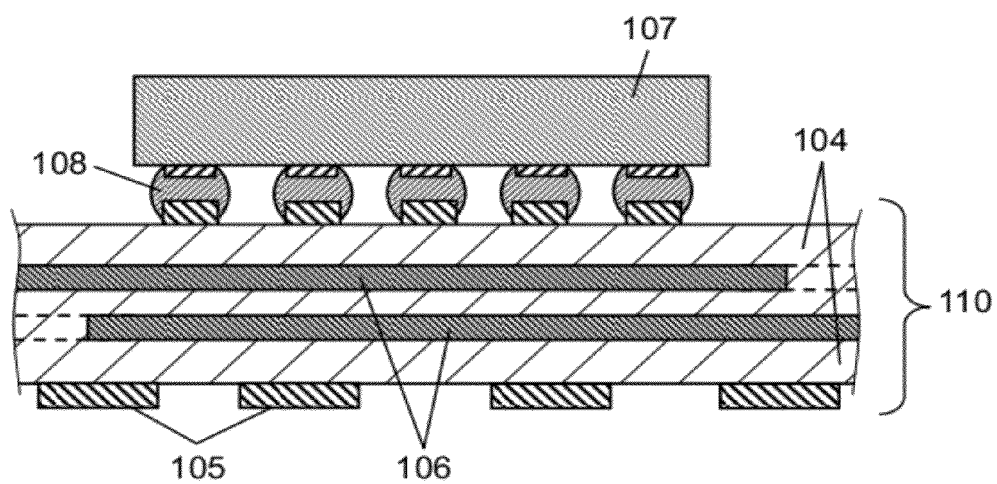
FIG. 5B is a sectional view illustrating the process for production of the module in accordance with the first exemplary embodiment of the present invention.

FIG. 5B is a sectional view showing a state in which electronic component 107 is mounted on circuit board 110. It is desirable that wiring 105 provided on a side of a surface of circuit board 110 on which electronic component 107 is mounted be necessary minimum (that is to say, only a part to be mounted via mount part 108). This is because when the surface of wiring 105 provided on the side of a surface of circuit board 110 on which electronic component 107 is mounted is brought into contact with sealing part 109, shortage of adhesion, solder flush, or the like, may occur.

Figure 6A:
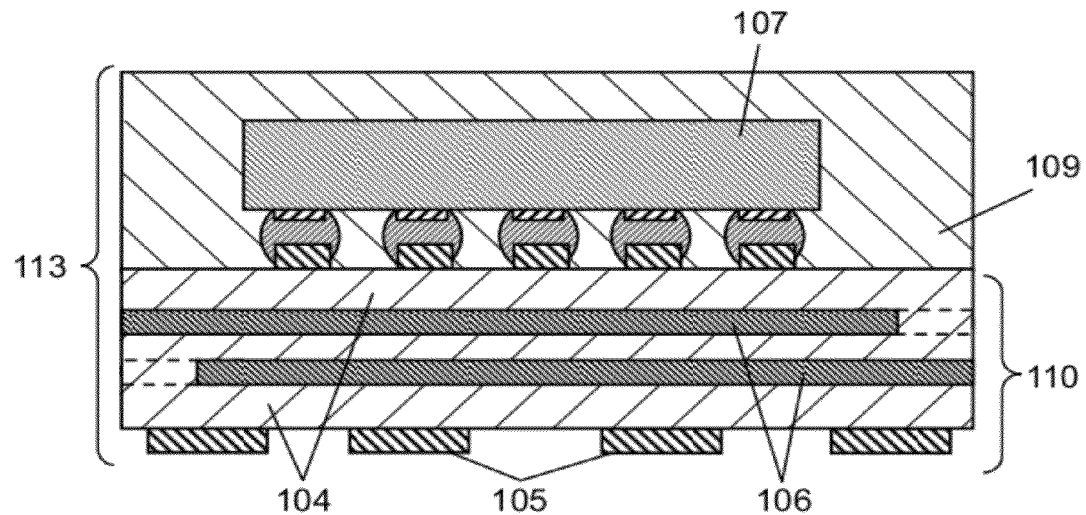
FIG. 6A is a sectional view illustrating the process for production of the module in accordance with the first exemplary embodiment of the present invention.
Figure 6B:
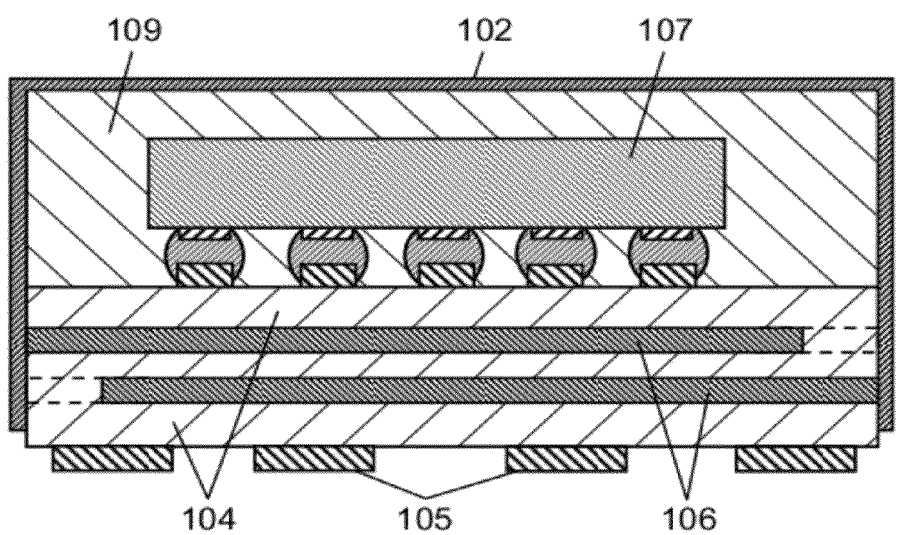
FIG. 6B is a sectional view illustrating the process for production of the module in accordance with the first exemplary embodiment of the present invention.

FIGS. 6A and 6B are sectional views illustrating an example of the process for production of module 101. Divided unit 113 is obtained by mounting a plurality of electronic components 107 on one large circuit board 110 and covering thereof with an epoxy resin and the like to form sealing part 109, followed by cutting into individual pieces. Production of divided unit 113 is described again with reference to the below-mentioned FIGS. 10A to 10E.

As shown in FIG. 6A, divided unit 113 is formed. Thereafter, as shown in FIG. 6B, metal film 102 is formed. Thus, adhesiveness between exposed part 111 of copper foil 106 and metal film 102 formed thereon is improved.

FIG. 7A is a perspective view showing the module before the metal film is formed in accordance with the first exemplary embodiment of the present invention. FIG. 7B is a perspective view showing the module after the metal film is formed in accordance with the first exemplary embodiment of the present invention. A state in which metal film 102 is formed so as to cover exposed part 111 is described with reference to FIGS. 7A and 7B.

FIG. 7A is a perspective view showing divided unit 113 obtained by covering electronic component 107 mounted on circuit board 110 (see FIG. 6A) with a sealing material to form sealing part 109 and then dividing thereof into a predetermined shape. Note here that a plurality of electronic components 107 may be mounted on one circuit board 110, electronic components 107 and circuit board 110 as a whole may be covered with a sealing material at once (or separately if necessary), and then divided into a plurality of divided units. In dividing, divided unit 113 can be obtained as a quadrilateral shape having four linear sides by using a dicing machine and the like. Thus, workability can be enhanced.

It is desirable that divided unit 113 have a quadrangle shape such as a square and a rectangle (a rectangular parallelepiped for a three-dimensional shape) seen from the upper part. With such a structure, it is possible to easily divide and cut a large sealed structure into a plurality of small divided units 113. When the structure is divided, circuit board 110 and sealing part 109 can be simultaneously divided and cut by using a dicing machine.

FIG. 7B is a perspective view showing a state after metal film 102 is formed on divided unit 113 by using a sputtering device. It is desirable that metal film 102 be formed by a sputtering method. When the sputtering method is used, an adhesion force with respect to epoxy layer 104 as a base material and exposed part 111 can be enhanced. If necessary, metal film 102 can be formed by carrying out a plating method or by coating a conductive paste.

As shown in FIG. 7A, it is useful that two layers or more of copper foil 106 are formed, and at least a part of exposed parts 111 are shifted from each other in the thickness direction.

In FIG. 7B, dotted lines show exposed parts 111 hidden under metal film 102. It is desirable that exposed parts 111 be provided on a plurality of side surfaces (desirably, three side surfaces, and further desirably, four side surfaces) of circuit board 110.

Figure 8A:
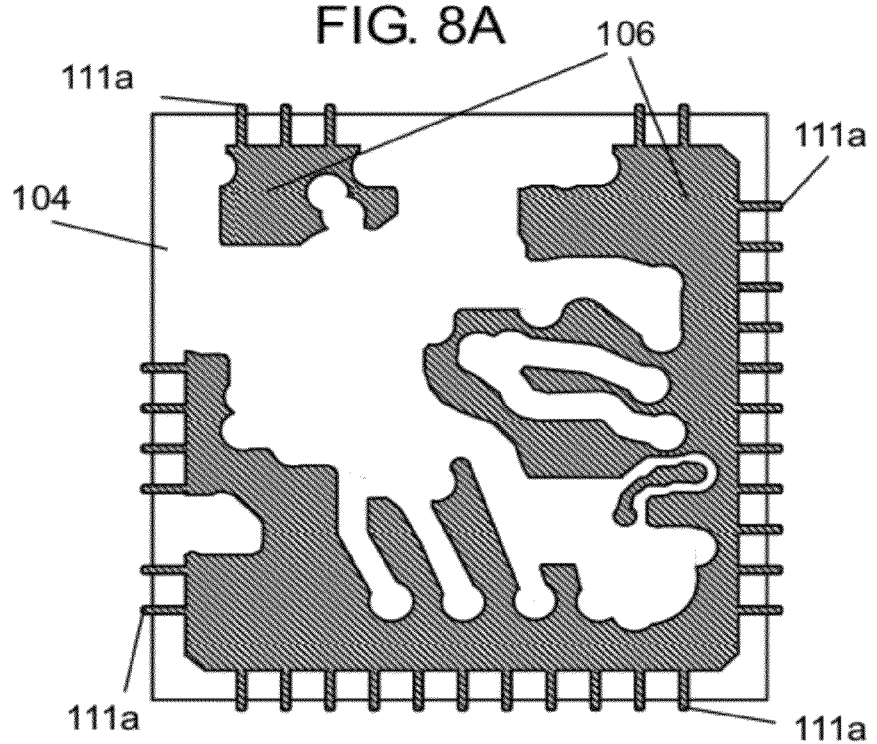
FIG. 8A is a top view showing a copper foil pattern of the module in accordance with the first exemplary embodiment of the present invention.
Figure 8B:
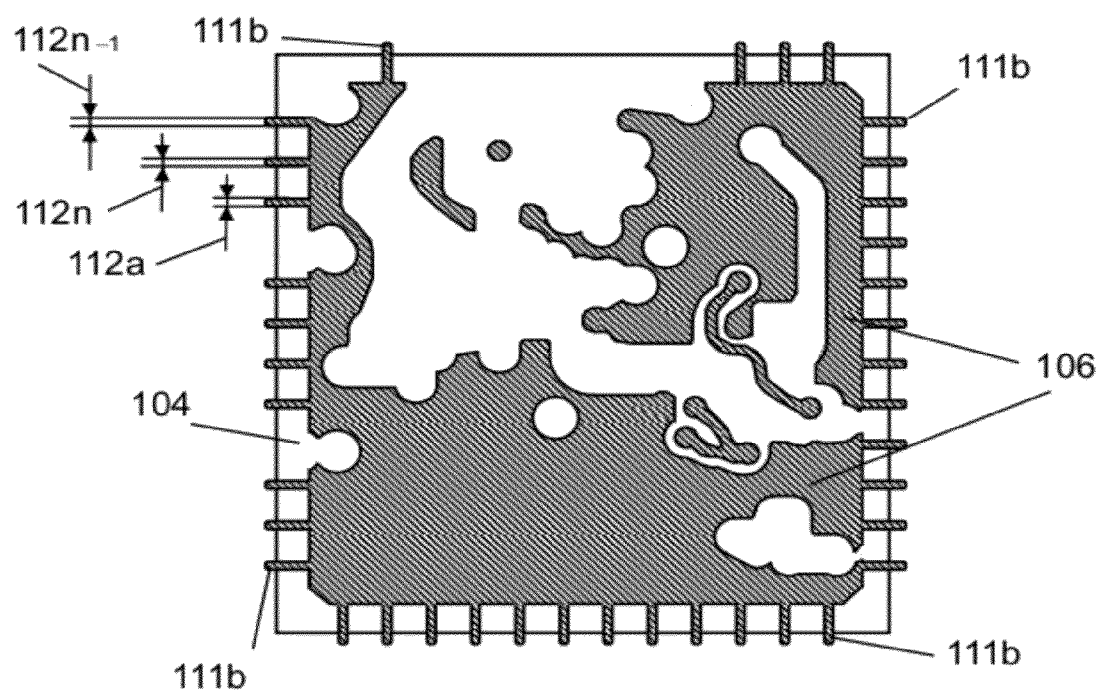
FIG. 8B is a top view showing a copper foil pattern of the module in accordance with the first exemplary embodiment of the present invention.

FIGS. 8A and 8B are top views showing an example of copper foil 106 patterns of module 101 (see FIG. 7A) in accordance with the first exemplary embodiment of the present invention. A plurality of copper foil 106 patterns shown in FIGS. 8A and 8B are formed on circuit board 110 (see FIG. 7A), followed by dividing thereof so as to form exposed part 111 (see FIG. 7A). In FIGS. 8A and 8B, exposed part 111a denotes exposed part 111 of copper foil 106 in epoxy layer 104 in the second layer, and exposed part 111b denotes exposed part 111 of copper foil 106 in epoxy layer 104 in the first layer.

As shown in FIGS. 8A and 8B, when copper foil 106 is patterned, exposed parts 111 shown in FIGS. 2 to 4 and 7A can be formed on the side surfaces of module 101.

By laminating the patterns shown in FIGS. 8A and 8B in the thickness direction, exposed parts 111 can be formed in a staggered state in the thickness direction as shown in FIG. 7A and 7B.

Next, optimization of a pattern width of copper foil 106 exposed to an end portion of circuit board 110 (a width of exposed part 111) is described with reference to Tables 1, 2, and 3.

Table 1 shows an example of evaluation results of the relation between a pattern width of exposed part 111 (a width of exposed part 111) including copper foil 106 exposed to the side surface of circuit board 110 and the occurrence of a peeled portion. A blushing rate in Table 1 represents a rate of occurrence of peeling. Presence or absence of peeling is represented as presence or absence of blushing.

TABLE 1

Relation between pattern width (width of exposed part) and blushing rate

| Pattern width (μm) | 18 | 36 | 72 | 100 | 150 | 200 | 300 |
|---|---|---|---|---|---|---|---|
| Blushing rate (%) | 0 | 0 | 0 | 0 | 0 | 50 | 100 |

A preparation method of samples to be evaluated in Table 1 is described below. One large epoxy substrate (N=10) is provided with two layers of copper foil 106 shown in FIGS. 5A and 5B. Copper foil 106 has a thickness of 36 μm. Furthermore, module 101 substrate is prepared as shown in FIGS. 6A, 6B, 7A, 7B, 8A, and 8B. Finally, sealing part 109 and circuit board 110 are cut into a predetermined shape (for example, 5 mm×5 mm) by using a dicing machine. Exposed part 111 exposed on the cut surface is observed under a microscope, and presence or absence of occurrence of a peeled portion is examined. The examination results are shown in Table 1.

The pattern width in Table 1 represents the width of each of the exposed parts shown by arrows 112a to 112n in FIGS. 2 to FIG. 4 and the unit is μm.

The blushing rate in Table 1 is evaluated to be occurrence (NG) when peeling, crack, or the like, even though it is few, occurs in one exposed part 111, and evaluated to be good (OK) when no peeling, crack, or the like, occurs in exposed part 111. Then, the number of NG cases is represented by percentage with respect to the total of plurality of exposed parts 111.

From Table 1, it is shown that when the width of exposed part 111 is 150 μm or less, no peeled portions occur. Furthermore, it is shown that when the width of exposed part 111 is 200 μm or more, a peeled portion easily occurs.

From the results of Table 1, it is shown that when the pattern width is a predetermined width or more (for example, 200 μm or more), the blushing rate rapidly increases. This means that when a peeled portion partially occurs due to dicing and the like, the peeled portion grows to be large. Alternatively, it means that after copper foil 106 and epoxy layer 104 are once peeled off from each other in an interface therebetween, they do not adhere to each other again or do not bond to each other again.

From these experiment results, peeling (or blushing) can be considered as follows. That is to say, copper foil 106 and epoxy layer 104 are not always peeled off from each other at the interface therebetween due to dicing. When copper foil 106 and epoxy layer 104 are diced simultaneously, until the pattern width reaches a threshold length (width of the exposed part), a bonding force of at least the interface between copper foil 106 and epoxy layer 104 restrains a peeling force due to dicing. However, when the pattern width is more than the threshold length, a bonding force of at least the interface between copper foil 106 and epoxy layer 104 is inferior to the peeling force by dicing, and, as a result, peeling occurs. When peeling occurs once, the peeling further expands. The threshold is thought to be a length from the right side to the left side of exposed part 111. This is because when copper foil 106 is cut, the occurrence rate of peeling is low in an end portion of exposed part 111 at which dicing is started and an end portion of exposed part 111 at which dicing is finished, and a peeled portion easily occurs in the middle portion of exposed part 111.

The results show that peeling, blushing, crack, or the like, easily occurs when a sealing structure including sealing part 109 and circuit board 110 is divided. Note here that presence of residues (for example, inorganic filler) generated when sealing part 109 is cut is expected to cause the occurrence of such blushing and crack. This can be also analogized from the results that the same results are obtained as in the above-mentioned Table 1 although the thickness of copper foil 106 is changed from 12 μm to 36 μm.

An example of reduction of leakage of noise by optimizing a space between exposed parts 111 (hereinafter, which is referred to as a slit width) is described with reference to Tables 2 and 3.

Table 2 shows an example of EMI evaluation of the slit width that is the space between a plurality of exposed parts 111, and leakage of a signal, that is, a noise.

In Table 2, "λ" represents a wavelength of unnecessary radiation in a band of 2.4 GHz, which is generated in the module. A staggered state represents a state in which exposed parts 111 provided in plurality of layers of copper foil 106 are disposed in such a manner that they are shifted from each other in the thickness direction as shown in FIG. 4. A parallel state represents a state in which exposed parts 111 provided in plurality of layers of copper foil 106 are disposed in such a manner that they are overlapped on each other as shown in FIG. 3.

TABLE 2

Relation between slit width and state of exposed part and shielding effect

| Slit width | State of exposed part | |
|---|---|---|
| | Staggered state | Parallel state |
| Case where slit width is smaller than λ/8 | −91.7 dB | −90.7 dB |
| Case where slit width is larger than λ/8 | −88.2 dB | −82.6 dB |

In Table 2, it is shown that the smaller the numerical value is, the higher the state of shielding effect is. In Table 2, when the ground connection length is defined as L, L<(λ/8) is satisfied. Furthermore, slit width W satisfies W<3 L. In Table 2, W is a value that is little bit smaller than 3 L.

From Table 2, it is shown that exposed parts 111 are better to be disposed in a staggered state (a state in which exposed parts 111 are shifted from each other in the thickness direction of copper foil 106) rather than in parallel (a state in which exposed parts 111 are substantially completely identical to each other in the thickness direction of copper foil 106). Note here that Table 2 shows evaluation results in the fundamental frequency of 2.4 GHz.

Table 3 shows an example of evaluation results of the relation between ground connection total length L and EMI.

TABLE 3

Relation between ground connection length and shielding effect when exposed parts are disposed in parallel.

| | Ground connection length L (%) | | | | | |
|---|---|---|---|---|---|---|
| | 100 | 75 | 50 | 30 | 20 | 15 |
| Shielding effect | −92.0 dB | −91.5 dB | −91.1 dB | −90.7 dB | −82.6 dB | −68.3 dB |

Table 3 is a table showing a shielding effect at 2.4 GHz when ground connection total length L is changed. Simulation results of the shielding effect when the connection state is reduced until 15% with respect to 100%. A connection state in which the entire periphery of module 101 is connected to the ground is defined as 100%.

In Table 3, the smaller the numerical value is, the higher the state of shielding effect is. It is shown that in order to obtain a shielding effect of −68 dB or less (when module 101 is used), ground connection total length L is required to be 15% or more with respect to the entire periphery of module 101.

The shielding effect of module 101 having a conventional structure using a metallic cover structured shielding material is about −70 dB. Thus, when ground connection total length L secures approximately 20% or more with respect to the entire periphery of module 101, a level with no problems can be achieved.

Note here that the upper limit of ground connection total length L is desirably 50% or less, and further desirably 75% or less (furthermore, 80% or less). It is because when the upper limit is more than 80%, metal film 102 may be peeled off.

Second Exemplary Embodiment

Figure 9A:
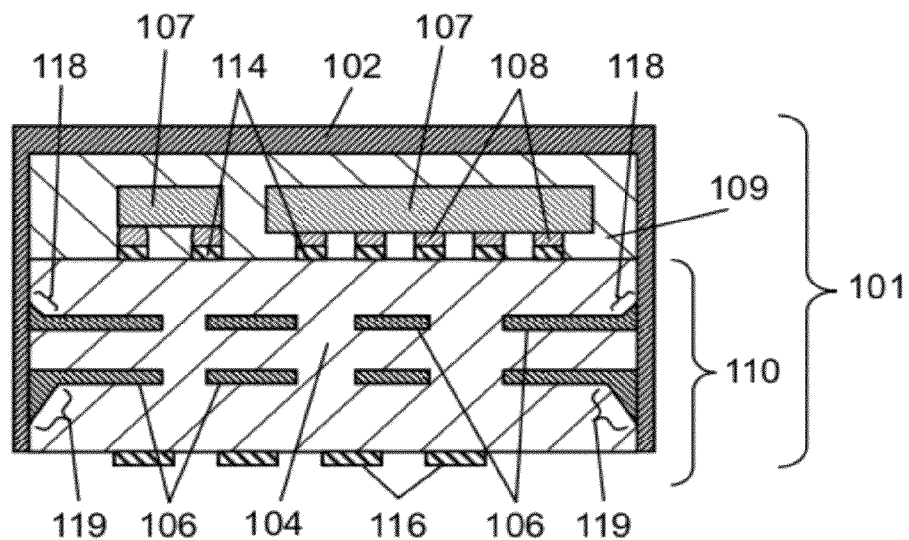
FIG. 9A is a sectional view of a module in accordance with a second exemplary embodiment of the present invention.
Figure 9B:
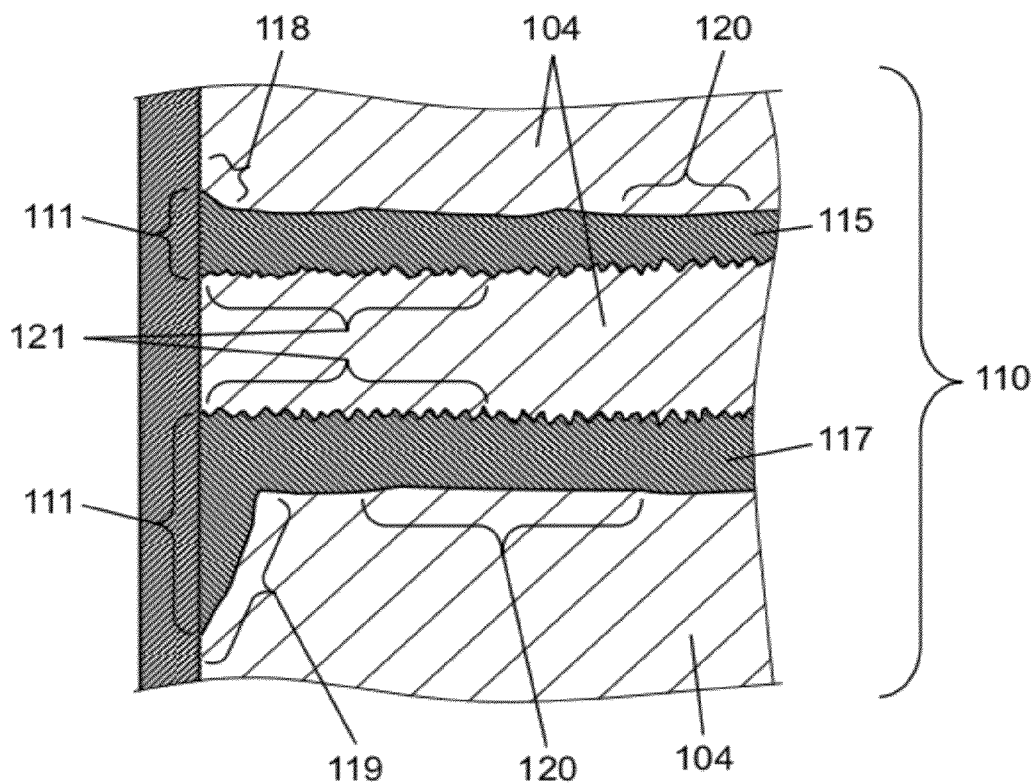
FIG. 9B is an enlarged sectional view of the module in accordance with the second exemplary embodiment of the present invention.

Next, an example of improvement in adhesiveness between of exposed part 111 of copper foil and metal film 102 is described with reference to drawings. FIGS. 9A and 9B are sectional views showing a module in accordance with a second exemplary embodiment of the present invention. A plurality of electronic components 107 are mounted on upper-surface wiring 114 via mount parts 108.

Circuit board 110 includes upward inner layer wiring 115 and downward inner layer wiring 117. Both downward inner layer wiring 117 and upward inner layer wiring 115 are inner layer wiring embedded in circuit board 110. A part of the inner layer wiring serves as a ground pattern. A part of copper foil 106 (a ground layer) constituting the inner layer wiring serving as the ground pattern is exposed to the side surface of circuit board 110 to form exposed part 111.

FIG. 9A is a sectional view of module 101 in accordance with the second exemplary embodiment. As shown in FIG. 9A, module 101 includes circuit board 110, sealing part 109, and metal film 102 covering thereof. Metal film 102 is formed by a thin film method such as sputtering.

Circuit board 110 includes epoxy layer 104, one or more layers of upward inner layer wiring 115, one or more layers of downward inner layer wiring 117, upper-surface wiring 114, and rear-surface wiring 116. Epoxy layer 104 is formed by impregnating a core material such as glass fiber (not shown) with an epoxy resin (not shown).

Upper-surface wiring 114 is wiring provided on a surface of circuit board 110 on sealing part 109 side or on a side of electronic components 107 embedded in sealing part 109, and corresponds to a portion to which electronic component 107 is mounted via mount part 108.

Rear-surface wiring 116 is wiring provided on a portion that is not a mold side of circuit board 110, and provided for mounting module 101 on other circuit boards (not shown) or a mother board (not shown).

Upward inner layer wiring 115 is one of inner layer wiring embedded in circuit board 110, and includes copper foil 106 constituting wiring whose glossy surface 120 faces upward (that is, upper-surface wiring 114 side). Note here that roughened surface 121 side of upward inner layer wiring 115 faces downward (that is, rear-surface wiring 116 side).

Downward inner layer wiring 117 includes copper foil constituting wiring whose glossy surface 120 faces downward, that is, the opposite side of sealing part 109 or rear-surface wiring 116 side. Note here that the term "downward" is used for convenience, and means the opposite side to the mold. Note here that roughened surface 121 side of downward inner layer wiring 117 faces upward (that is, upper-surface wiring 114 side). For downward inner layer wiring 117 and upward inner layer wiring 115, copper foil 106 having glossy surface 120 at one side and roughened surface 121 at the other side (which is referred to as a "one-side glossy copper foil") is used. This is because glossy surface 120 is excellent in pattern dissolution at the time of exposure, and roughened surface 121 is excellent in adhesiveness with respect to epoxy layer 104 side, respectively. Furthermore, in order to form one surface of the copper foil into glossy surface 120 and to form the other surface into roughened surface 121, it is useful to use a treatment solution or a roughening solution.

In FIGS. 9A and 9B, as metal film 102, metal film 102 as a shield is formed on five surfaces of module 101 (five surfaces in total, that is, a ceiling surface and four side surfaces) by using a sputtering device (not shown). By forming metal film 102 by using a sputtering device, the metal film can be thinned, and furthermore, resistance of the metal film can be reduced.

Furthermore, on connection portions between metal film 102 and upward inner layer wiring 115 and downward inner layer wiring 117 each serving as a ground (upward inner layer wiring 115 and downward inner layer wiring 117 exposed to the cross section of circuit board 110), first sagging portion 118 and second sagging portion 119 are formed, respectively. Thus, a connection area between upward inner layer wiring 115 and metal film 102 as well as a connection area between downward inner layer wiring 117 and metal film 102 can be increased, respectively, and an effect of enhancing a shielding property can be obtained. The "sagging" in the present invention corresponds to one generated during a metalworking process. Such sagging may be also referred to as "shear drop" or "shear droop" in English. This is because when metal film 102 is provided on five surfaces of module 101 by using a sputtering device, the film thickness of metal film 102 at the side surface side of module 101 tends to be thinner than the film thickness of metal film 102 on the ceiling surface side of module 101. Furthermore, by forming first sagging portion 118 and second sagging portion 119, a connection area between upward inner layer wiring 115 and downward inner layer wiring 117 and metal film 102 can be increased. When a resistance value of metal film 102 is reduced in this way, an effect of enhancing a shielding property can be further obtained.

Furthermore, by making the size of second sagging portion 119 larger than that of first sagging portion 118, in the lower side of circuit board 110 in which a shielding property is easily reduced, connection resistance between downward inner layer wiring 117 serving as a ground and metal film 102 can be reduced. That is to say, electrical connection reliability and the shielding property of module 101 can be improved. Herein, the size of the sagging portion includes any one or more of a width, an area, and a thickness of the sagging portion, and the lower side of circuit board 110 means a mother board side on which module 101 is to be mounted, or rear-surface wiring 116 side.

FIG. 9B is a partially enlarged sectional view showing a vicinity of first sagging portion 118 and second sagging portion 119 of FIG. 9A. As shown in FIG. 9B, first sagging portion 118 is formed on glossy surface 120 side of upward inner layer wiring 115, and second sagging portion 119 is formed on glossy surface 120 side of downward inner layer wiring 117.

Note here that first sagging portion 118 may be small, but second sagging portion 119 desirably has a predetermined size or more (desirably, 0.5 times or more and 10 times or less as large as the thickness of downward inner layer wiring 117). This is because when second sagging portion 119 is made to be larger in the lower side of circuit board 110 in which the shielding property is easily reduced, connection resistance between internal wiring serving as a ground and metal film 102 serving as a shielding portion is reduced.

Furthermore, when epoxy layer 104 including a core material such as glass fiber 125 is used, even if a clearance portion is provided on a cross section on epoxy layer 104 side of the lower part of module 101, a growth of the clearance portion can be controlled by the core material. Herein, the lower part of module 101 refers to a portion between downward inner layer wiring 117 and rear-surface wiring 116. The clearance portion refers to, for example, void 124 mentioned below. Furthermore, even if a crack and the like occur, the core material included in epoxy layer 104 prevents an epoxy resin contained in epoxy layer 104 from falling.

For sealing part 109, it is possible to use a sealing material including, for example, an epoxy resin to which inorganic filler and the like for adjusting the thermal expansion coefficient is added.

For copper foil 106 constituting upper-surface wiring 114, upward inner layer wiring 115, downward inner layer wiring 117, rear-surface wiring 116, and the like, electrolytic copper or rolled copper is used. By selecting the thickness of the copper foil from, for example, 12 μm, 18 μm, and 36 μm, exposed parts from circuit board 110 (and furthermore, first sagging portion 118 and second sagging portion 119) can be easily formed.

Third Exemplary Embodiment

Next, as a third exemplary embodiment, an example of a process for production of module 101 (see FIG. 9A) is described with reference to FIGS. 10A to 11B.

FIGS. 10A to 10E are sectional views illustrating a process for production of module 101 in accordance with the third exemplary embodiment of the present invention.

As bonding layer 122, for example, a dicing tape can be used. Dicing groove 123 corresponds to a dividing groove formed by dicing.

Figure 10A:
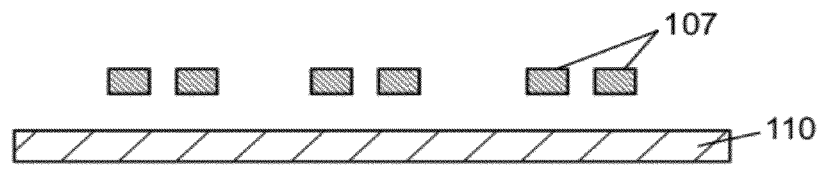
FIG. 10A is a sectional view illustrating a process for production of a module in accordance with a third exemplary embodiment of the present invention.

As shown in FIG. 10A, electronic components 107 are mounted on circuit board 110.

Figure 10B:
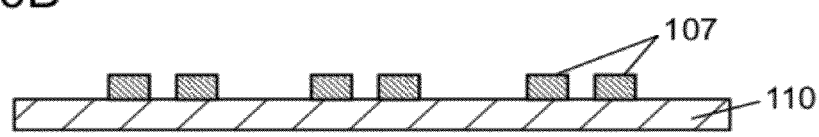
FIG. 10B is a sectional view illustrating the process for production of the module in accordance with the third exemplary embodiment of the present invention.

FIG. 10B is a sectional view showing a state in which electronic components 107 are mounted on circuit board 110.

Figure 10C:
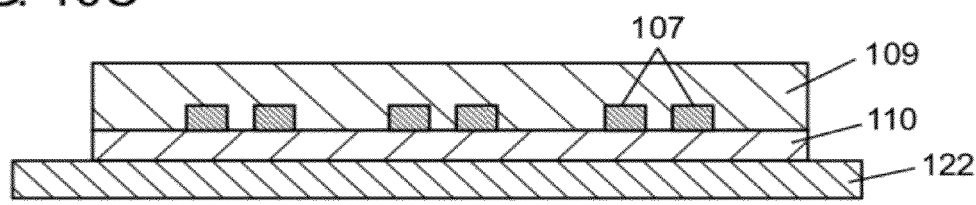
FIG. 10C is a sectional view illustrating the process for production of the module in accordance with the third exemplary embodiment of the present invention.

FIG. 10C is a sectional view showing a state in which sealing part 109 is formed on circuit board 110 on which electronic components 107 are mounted. Sealing part 109 can be made of a mold material (for example, an epoxy resin to which inorganic filler and the like for adjusting the thermal expansion coefficient is added). For molding, a die, a press mold, a heating system, and the like (which are not shown), can be used.

The thus obtained sample is fixed onto bonding layer 122 as shown in FIG. 10C. Thereby, dividing (or cutting) by using a dicing machine (not shown) can be facilitated.

Figure 10D:
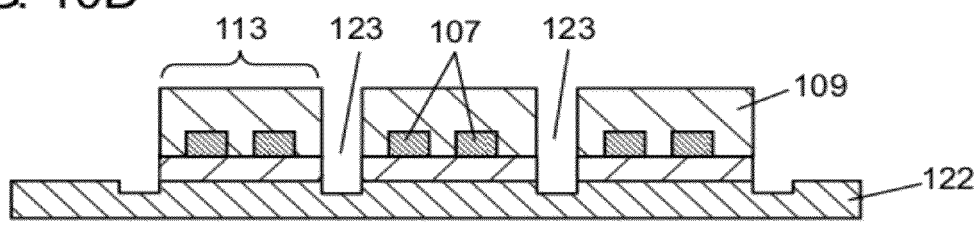
FIG. 10D is a sectional view illustrating the process for production of the module in accordance with the third exemplary embodiment of the present invention.

FIG. 10D is a sectional view showing a state in which the sample formed in FIG. 10C is divided (or cut) into a predetermined dimension by using a dicing machine.

Figure 10E:
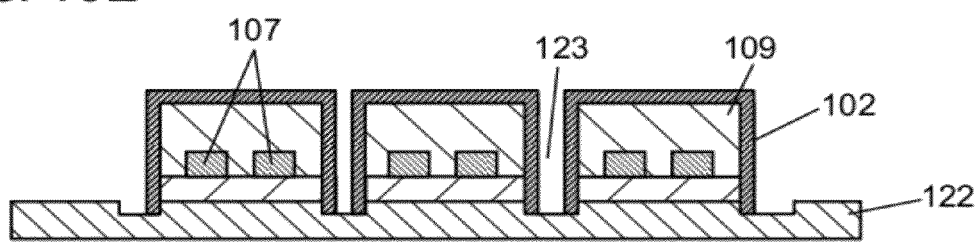
FIG. 10E is a sectional view illustrating the process for production of the module in accordance with the third exemplary embodiment of the present invention.

FIG. 10E is a sectional view illustrating a state in which metal film 102 is formed on the sample formed in FIG. 10D by using a sputtering device (not shown). In states from FIGS. 10D to 10E, individually divided (or cut) samples may be attached to a different bonding layer 122.

In FIGS. 10A to 10E, upper-surface wiring 114 for mounting electronic component 107 and rear-surface wiring 116, which are provided on the surfaces of circuit board 110, upward inner layer wiring 115 and downward inner layer wiring 117, solder resist, or the like, are not shown.

As mentioned above, as shown in FIGS. 10A to 10E, a plurality of electronic components 107 are mounted on one circuit board 110, and covered with a sealing material for molding at once to form a large sealing structure. Then, as shown in FIG. 10D, the sealing structure is divided (or cut) into a plurality of units by using, for example, a dicing machine so as to form individual modules (for example, divided unit 113 shown in FIG. 6A).

Figure 11A:
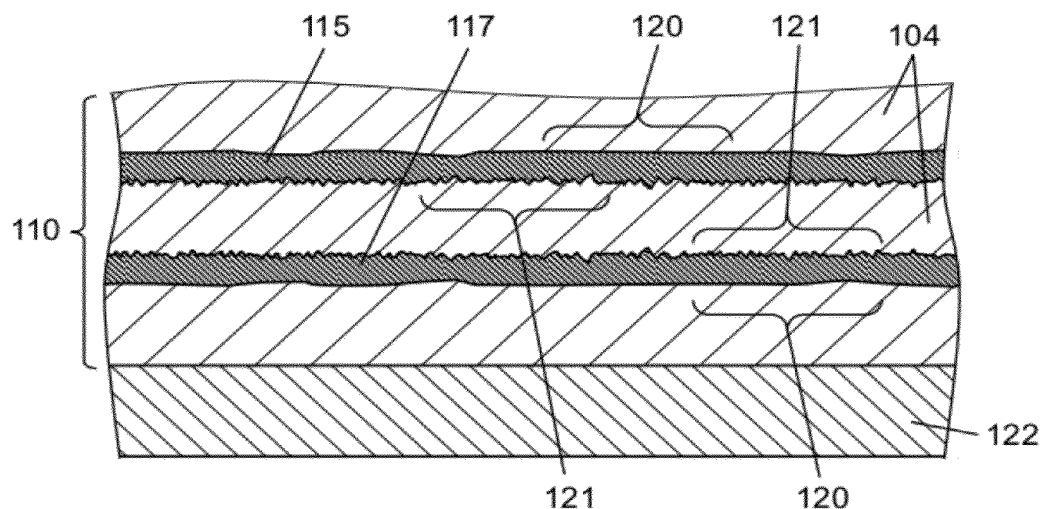
FIG. 11A is a sectional view illustrating a state in which the module is divided in accordance with the third exemplary embodiment of the present invention.
Figure 11B:
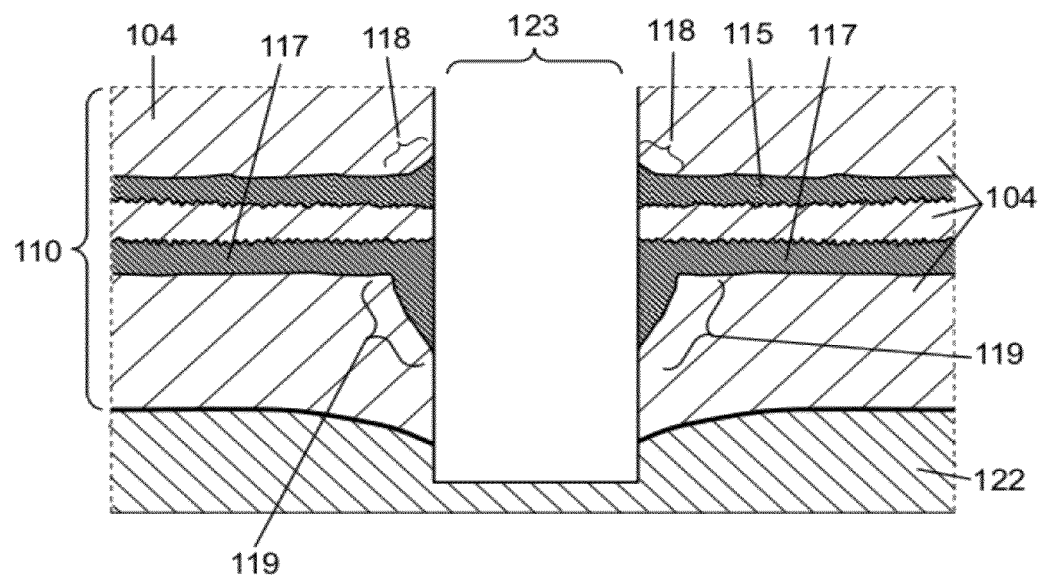
FIG. 11B is a sectional view illustrating a state in which the module is divided in accordance with the third exemplary embodiment of the present invention.

Next, a state in which module 101 is divided is described in more detail with reference to FIGS. 11A and 11B. FIGS. 11A and 11B are sectional views illustrating a state of dividing circuit board 110 of module 101 on which electronic component 107 is mounted in accordance with the third exemplary embodiment of the present invention.

FIG. 11A shows a state before circuit board 110 is diced, and FIG. 11B shows a state after circuit board 110 is diced, respectively.

As shown in FIG. 11A, circuit board 110 includes one or more layers of upward inner layer wiring 115, one or more layers of downward inner layer wiring 117, and a plurality of epoxy layers 104 for interlayer-connecting them. In FIGS. 11A and 11B, upper-surface wiring 114 and rear-surface wiring 116 provided on the surfaces of circuit board 110, solder resist, via hole portion for interlayer-connecting a plurality of inner layers are not shown.

In FIG. 11A, one or more layers of upward inner layer wiring 115 are formed in a state in which glossy surfaces 120 thereof face upper-surface wiring 114 side (not shown) provided on the upper side of circuit board 110. One or more layers of downward inner layer wiring 117 are formed in a state in which glossy surfaces 120 thereof face rear-surface wiring 116 side (not shown) provided on the lower side of circuit board 110.

Next, as shown in FIG. 11B, dicing groove 123 is formed, thereby making second sagging portion 119 larger than first sagging portion 118.

FIG. 11B shows a state after dicing is carried out. As shown in FIG. 11B, by applying a rotary blade (not shown) of a dicing machine to circuit board 110, dicing groove 123 is formed.

In FIG. 11B, first sagging portion 118 is a sagging portion generated on glossy surface 120 of upward inner layer wiring 115. Herein, the sagging portion is a portion generated as a sagging portion (or a kind of burr) from a part of a copper foil according to the rotation of the rotary blade of the dicing machine.

As shown in FIG. 11B, upward inner layer wiring 115 is provided in a portion upper from the middle portion (that is, on upper-surface wiring 114 side) of circuit board 110. Thus, first sagging portion 118 generated on glossy surface 120 side of upward inner layer wiring 115 can be made to be larger than a sagging portion (not shown) generated on roughened surface 121 side of upward inner layer wiring 115. This configuration makes it possible to improve adhesiveness between upward inner layer wiring 115 and epoxy layer 104 and to increase an adhesion area between a sectional portion of upward inner layer wiring 115 (including first sagging portion 118) and metal film 102.

Furthermore, as shown in FIG. 11B, downward inner layer wiring 117 is provided in a portion lower than the middle portion of circuit board 110 (that is, on rear-surface wiring 116 side). Thus, second sagging portion 119 generated on glossy surface 120 side of downward inner layer wiring 117 can be made to be larger than a sagging portion (not shown) generated on roughened surface 121 side of downward inner layer wiring 117. Furthermore, second sagging portion 119 generated on glossy surface 120 side of downward inner layer wiring 117 can be made to be larger than a sagging portion (not shown) generated on roughened surface 121 side of upward inner layer wiring 115. Furthermore, second sagging portion 119 generated on glossy surface 120 side of downward inner layer wiring 117 can be made to be larger than first sagging portion 118 provided on glossy surface 120 side of upward inner layer wiring 115. In this way, by making second sagging portion 119 provided on glossy surface 120 side of downward inner layer wiring 117 larger than the other sagging portions, an adhesion area between downward inner layer wiring 117 and metal film 102 can be increased. This is useful for solving the problem that when metal film 102 is formed by sputtering, the film thickness of the metal film of the lower side (at rear-surface wiring 116 side) is thinner than that of the upper side of circuit board 110 (upper-surface wiring 114 side, or sealing part 109 side) and a sheet resistance is increased.

Fourth Exemplary Embodiment

A further improved module is described with reference to FIGS. 12A and 12B.

Figure 12A:
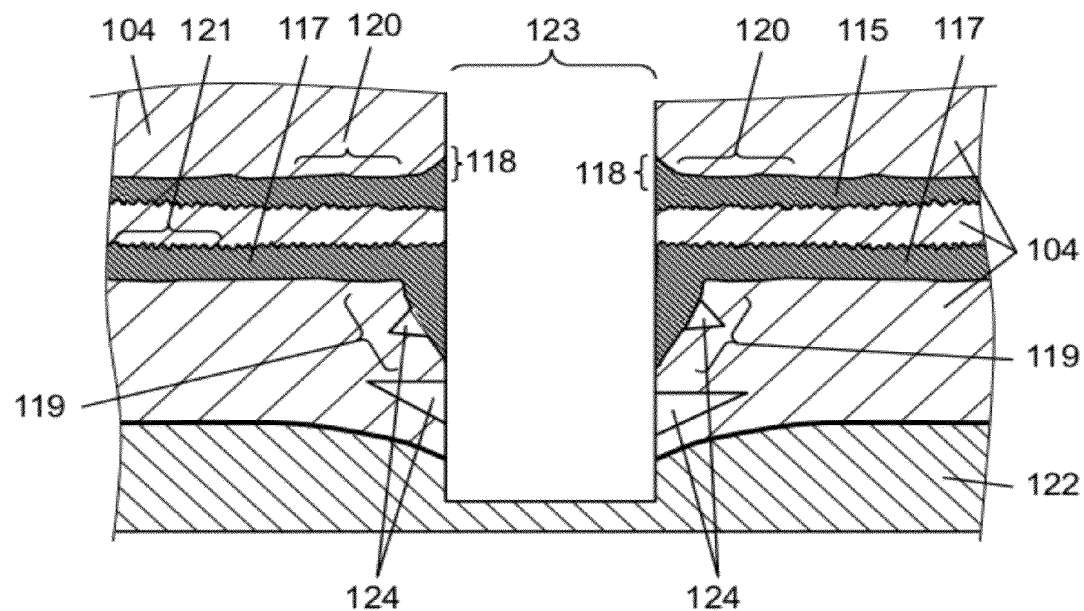
FIG. 12A is a sectional view showing a state in which a void is provided when a module is divided in accordance with a fourth exemplary embodiment of the present invention.
Figure 12B:
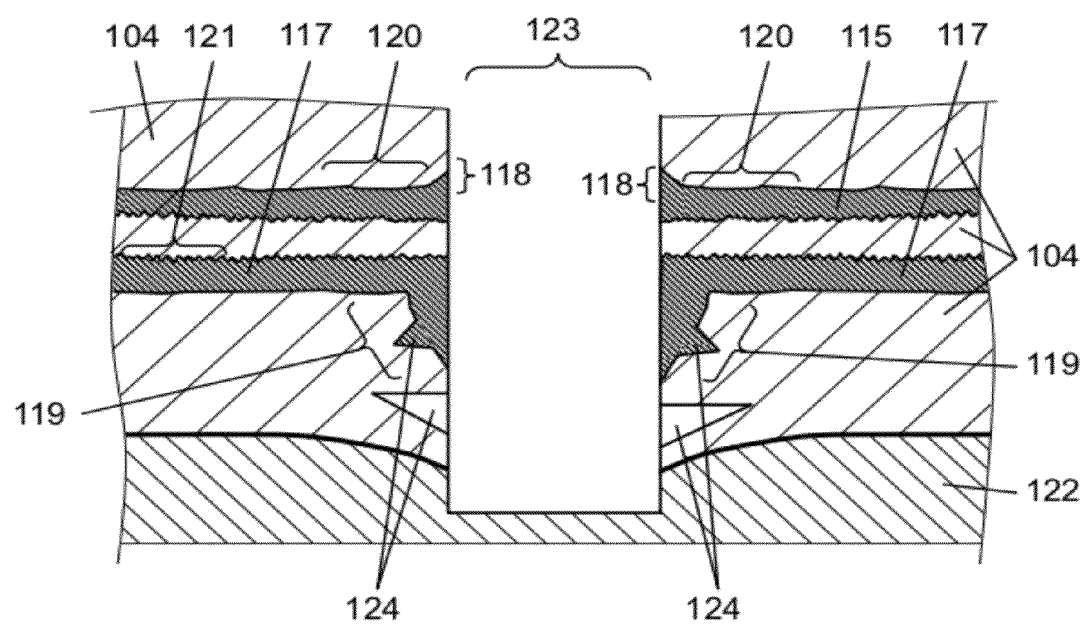
FIG. 12B is a sectional view showing a state in which the void is provided when the module is divided in accordance with the fourth exemplary embodiment of the present invention.

FIGS. 12A and 12B are sectional views showing a state in which a void is provided when the module is divided in accordance with the fourth exemplary embodiment of the present invention.

In FIG. 12A, voids 124 are provided on a rear surface side of circuit board 110 (a surface facing dicing groove 123 of epoxy layer 104 sandwiched between rear-surface wiring 116 and downward inner layer wiring 117).

FIG. 12A shows a state in which a part of epoxy layer 104 (insulating layer 104) is broken to form void 124 when dicing is carried out. FIG. 12B shows a state in which a part of void 124 formed in FIG. 12A is filled with a part of copper foil 106 (downward inner layer wiring 117 in the drawing).

As shown in FIGS. 12A and 12B, when a dicing is carried out, voids 124 are provided on a surface facing dicing groove 123 of epoxy layer 104 sandwiched between rear-surface wiring 116 and downward inner layer wiring 117. With void 124, adhesiveness between downward inner layer wiring 117 and epoxy layer 104 can be improved. Furthermore, when insulating film 131 is further provided on the outside of metal film 102, with void 124, the insulation property of metal film 102 and circuit board 110 can be enhanced.

As mentioned above, when a plurality of voids 124 are provided on the side surfaces of epoxy layer 104 and voids 124 are filled with a part of the downward inner layer wiring, the property of module 101 can be improved.

Figure 13:
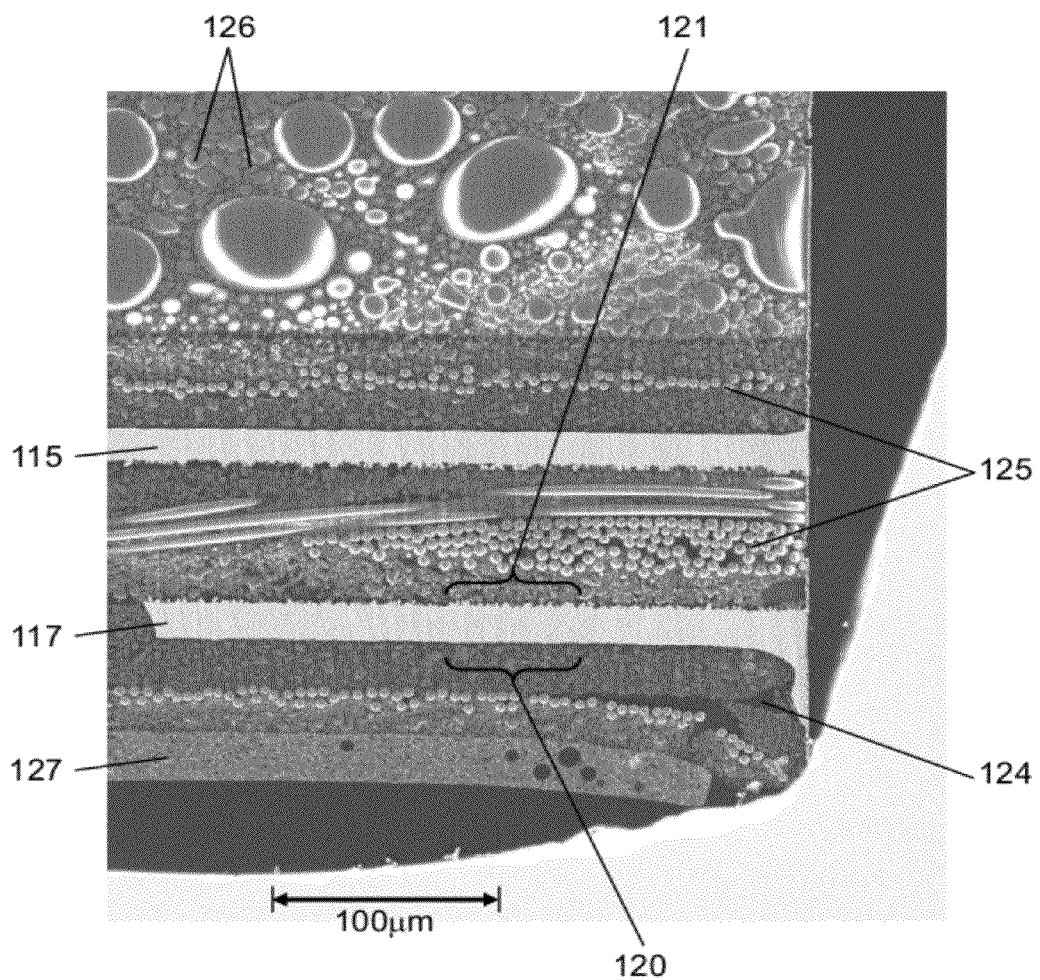
FIG. 13 is a scanning electron microscope (SEM) photograph showing a section of the module in accordance with the fourth exemplary embodiment of the present invention.
Figure 14:
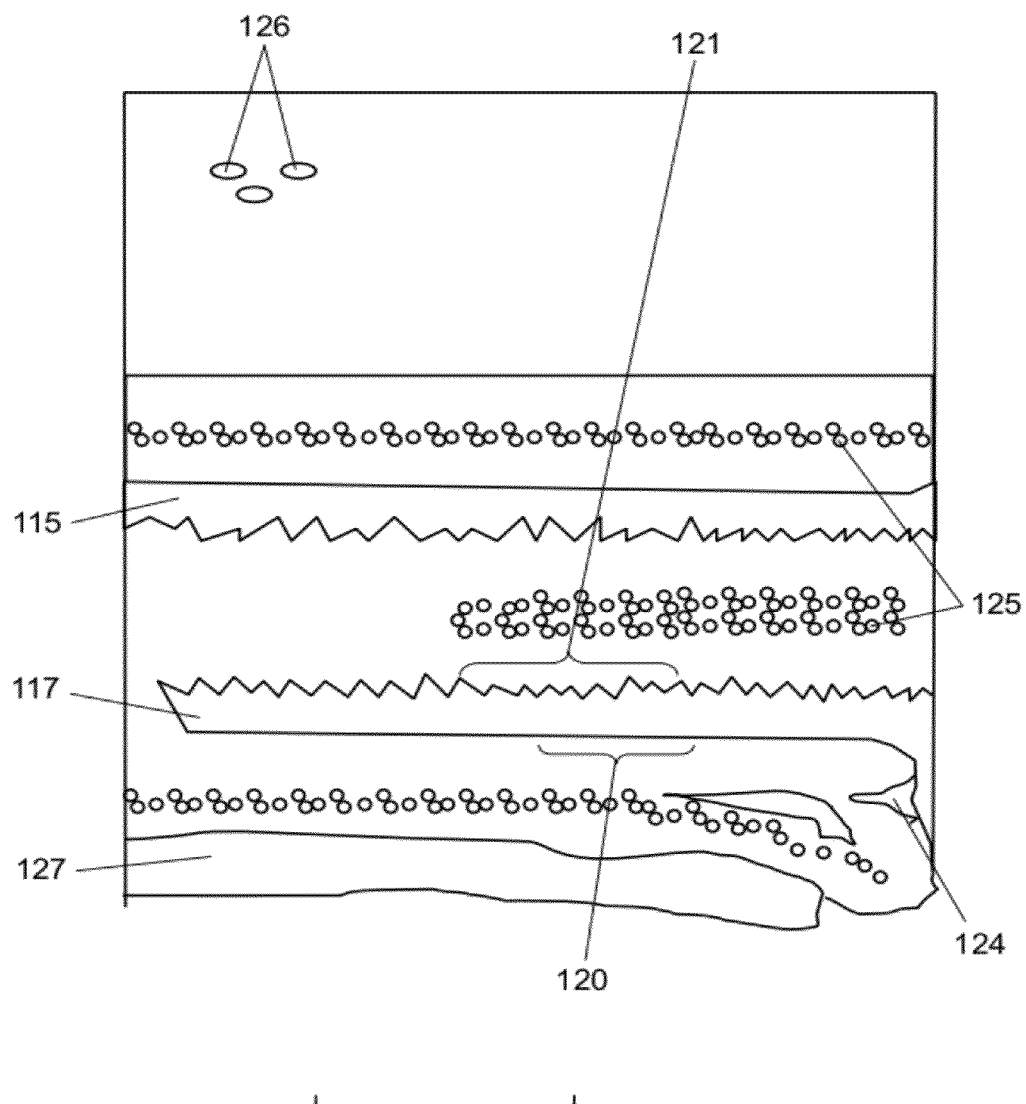
FIG. 14 is a schematic view of FIG. 13.

Next, a structure of circuit board 110 of module 101 is described with reference to FIGS. 13 and 14. FIG. 13 is a scanning electron microscope (SEM) photograph showing a section of the module in accordance with the fourth exemplary embodiment of the present invention. FIG. 14 is a schematic view of FIG. 13.

FIG. 13 shows an example of a SEM (scanning electron microscope) photograph showing a section of circuit board 110 of module 101 produced by the present inventors. In FIG. 13, a magnification is 200 times, and a scale shows a length of 100 μm. Circuit board 110 includes glass fiber 125, filler 126, solder resist 127, and the like.

Module 101 includes circuit board 110, electronic component 107, sealing part 109, and metal film 102. Circuit board 110 includes epoxy layer 104 obtained by impregnating a core material (for example, glass fiber 125) with an epoxy resin, upward inner layer wiring 115 including copper foil whose glossy surface 120 faces upward, and downward inner layer wiring 117 whose glossy surface 120 faces downward. Furthermore, circuit board 110 includes upper-surface wiring 114 and rear-surface wiring 116. Electronic component 107 is mounted on upper-surface wiring 114. Sealing part 109 seals electronic components 107 by molding on the circuit board. Furthermore, circuit board 110 includes upward inner layer wiring 115 exposed and having first sagging portion 118, and downward inner layer wiring 117 exposed and having second sagging portion 119. The surface of the sealing part is covered with metal film 102 by sputtering.

Then, voids 124 are provided on the side surfaces of epoxy layer 104 constituting module 101. Voids 124 are filled with a part of downward inner layer wiring 117 so as to make second sagging portion 119 larger. Furthermore, a plurality of voids 124 are provided on a section of epoxy layer 104 between downward inner layer wiring 117 and rear-surface wiring 116. Thus, second sagging portion 119 can be formed larger than first sagging portion 118. When metal film 102 is formed by, for example, sputtering, the thickness of metal film 102 is thinner nearer to the lower side (that is, rear-surface wiring 116 side). Therefore, it is useful to solve the problem that sheet resistance of metal film 102 is increased, so that connection to the copper foil serving as a ground becomes difficult.

As shown in FIGS. 13 and 14, it is desirable that a plurality of voids 124 be provided on the side surfaces (or dicing groove 123) of circuit board 110 (or epoxy layer 104). Note here that the term, plurality of voids 124, includes a case in which a part of one void 124 is branched into a plurality of parts. This is because even when only one void 124 is provided, if it is divided into a plurality of parts, a part of copper foil is easily filled in void 124, and an effect of enhancing adhesiveness (or an anchor effect) with respect to the insulating layer can be obtained.

Note here that it is desirable that voids 124 be provided on four side surfaces (or four surfaces facing dicing grooves 123) of circuit board 110, respectively. Thus, in all of the side surfaces of module 101, voids 124 are filled with a part of copper foil, and an effect of enhancing adhesiveness (or an anchor effect) with respect to epoxy layer 104 can be obtained.

It is useful that void 124 is a crack or a clearance provided on the section on epoxy layer 104 side, particularly, on a section at epoxy layer 104 side between downward inner layer wiring 117 and rear-surface wiring 116 (a rear-surface electrode is not shown).

It is also useful that void 124 is provided in epoxy layer 104 between downward inner layer wiring 117 and rear-surface wiring 116. Furthermore, by filling void 124 with a part of downward inner layer wiring 117 as second sagging portion 119, second sagging portion 119 can be enlarged, and the connection resistance between metal film 102 and downward inner layer wiring 117 can be reduced.

Furthermore, by using voids 124 (that is, by filling or pushing a part of copper foil constituting downward inner layer wiring 117 into a part of voids 124 when a dicing is carried out), second sagging portion 119 can be enlarged more effectively.

It is needless to say that by using void 124, second sagging portion 119 can be easily made to be larger than first sagging portion 118. Furthermore, a part of metal film 102 may enter the inside of voids 124.

Next, more detailed description is given with reference to FIGS. 15A, 15B, 16A, and 16B.

Figure 15A:
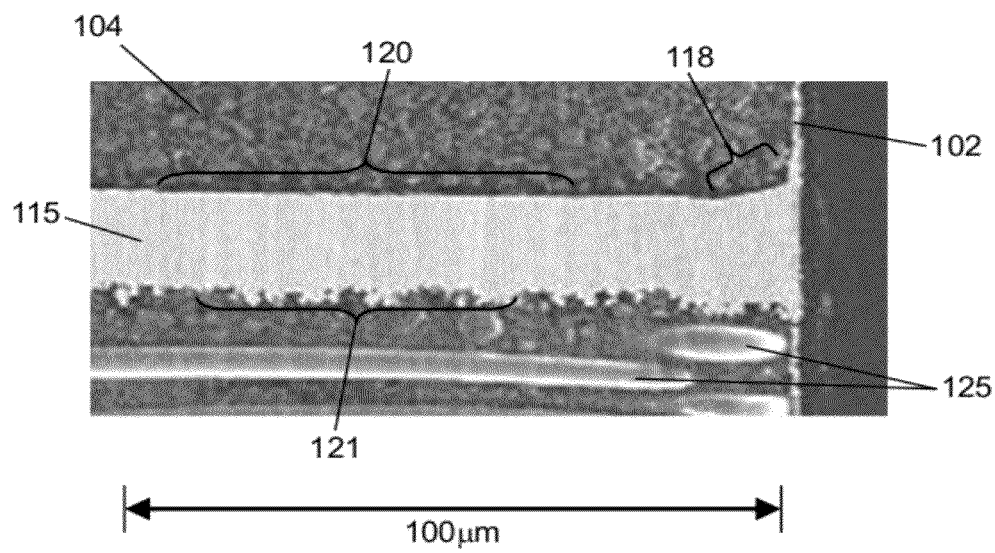
FIG. 15A is a partially enlarged photograph of FIG. 13.
Figure 15B:
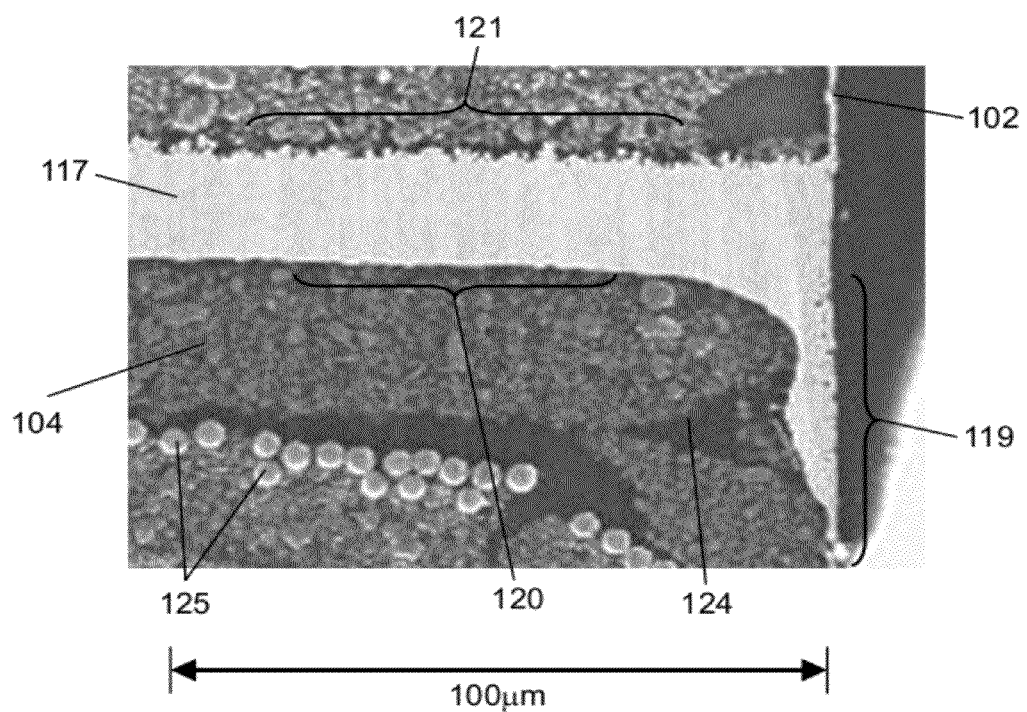
FIG. 15B is a partially enlarged photograph of FIG. 13.
Figure 16A:
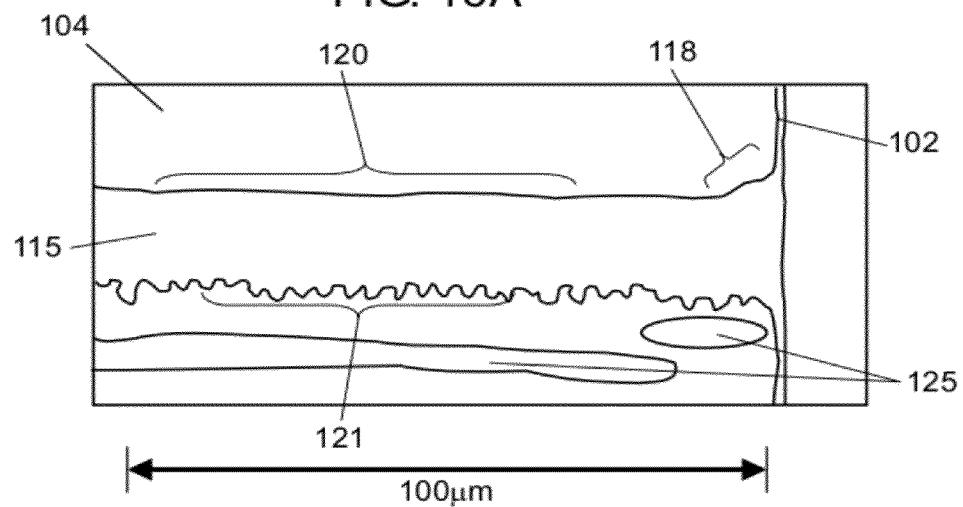
FIG. 16A is a schematic view of FIG. 15A.
Figure 16B:
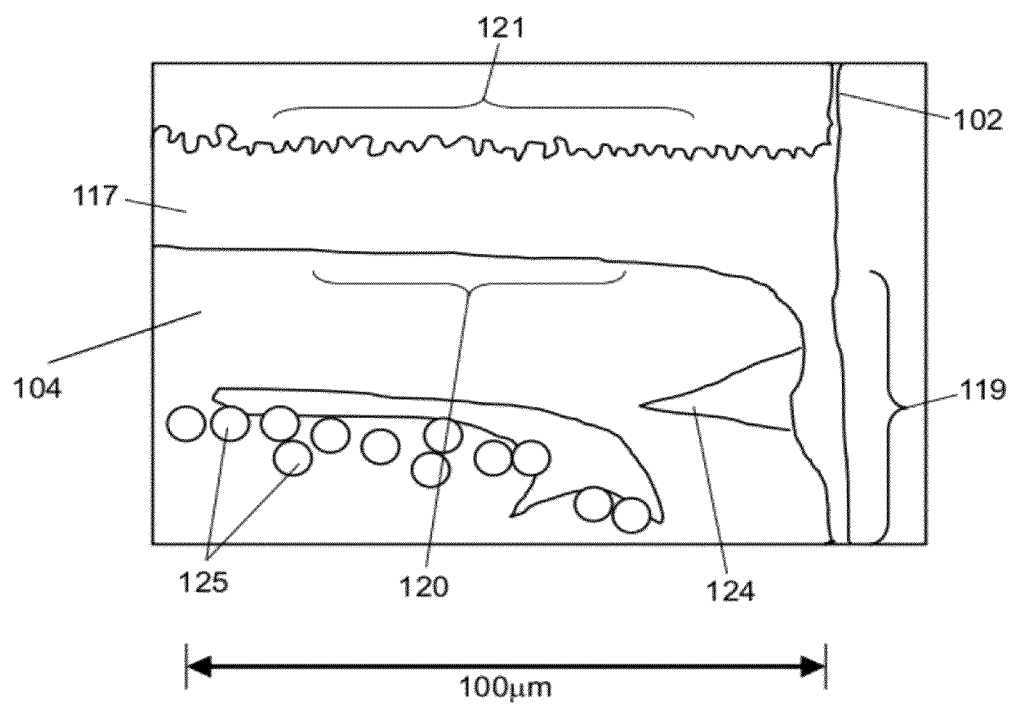
FIG. 16B is a schematic view of FIG. 15B.

FIGS. 15A and 15B show a partially enlarged photograph of FIG. 13. FIGS. 16A and 16B are schematic views of FIGS. 15A and 15B. FIG. 15A is an enlarged view of a connection portion between upward inner layer wiring 115 and metal film 102 shown in FIG. 13. As shown in FIG. 15A, by providing first sagging portion 118 on glossy surface 120 side of upward inner layer wiring 115, an adhesion area between upward inner layer wiring 115 and metal film 102 is increased, and therefore, mutual adhesion strength or contact resistance can be reduced. Note here that a sagging portion (reference numeral is not given) may be provided on roughened surface 121 side of upward inner layer wiring 115, but the size of the sagging portion is desirably reduced to about the size of roughened surface 121. Since first sagging portion 118 is formed using low adhesion between glossy surface 120 side of upward inner layer wiring 115 and epoxy layer 104 that is brought into contact with glossy surface 120 side, it can be formed in a large size.

FIG. 15B is an enlarged view of a connection portion between downward inner layer wiring 117 and metal film 102 shown in FIG. 13. As shown in FIG. 15B, by providing second sagging portion 119 on glossy surface 120 side of downward inner layer wiring 117, an adhesion area between downward inner layer wiring 117 and metal film 102 is increased, and therefore, mutual adhesion strength or contact resistance can be reduced. Note here that a sagging portion (reference numeral is not given) may be provided on roughened surface 121 side of downward inner layer wiring 117, but the size of the sagging portion is desirably reduced to about the size of roughened surface 121. Since second sagging portion 119 is formed using low adhesion between glossy surface 120 side of downward inner layer wiring 117 and epoxy layer 104 that is brought into contact with glossy surface 120 side, it can be formed in a large size.

Furthermore, it is useful that voids 124 are provided, and a part of voids 124 are filled with a part of downward inner layer wiring 117 as second sagging portion 119.

As shown in FIG. 15B, when a crack (or clearance) is used as void 124, since a further growth of the crack (or the clearance) can be suppressed by glass fiber 125 embedded in epoxy layer 104, reliability or the like is not affected.

In FIGS. 15A and 15B, a scale is 100 μm. It is desirable that the maximum length of void 124 be less than 200 μm (desirably 100 μm or less), and the thickness (or height) of void 124 is 50 μm or less (desirably 30 μm or less). When the maximum length of void 124 is more than 200 μm, or the thickness of void 124 is more than 50 μm, a suppression effect by glass fiber 125 may be deteriorated.

FIG. 16A is a schematic view of the connection portion between upward inner layer wiring 115 and metal film 102 shown in FIG. 15A. As shown in FIG. 16A, by providing first sagging portion 118 on glossy surface 120 side of upward inner layer wiring 115, an adhesion area between upward inner layer wiring 115 and metal film 102 can be increased, and therefore, mutual adhesion strength or contact resistance can be reduced. FIG. 16B is a schematic view of the connection portion between downward inner layer wiring 117 and metal film 102 shown in FIG. 15B. As shown in FIG. 16B, by providing second sagging portion 119 on glossy surface 120 side of downward inner layer wiring 117, an adhesion area between downward inner layer wiring 117 and metal film 102 can be increased, and therefore, mutual adhesion strength or contact resistance can be reduced.

Furthermore, it is useful that voids 124 are provided and a part of voids 124 are filled with a part of downward inner layer wiring 117 as second sagging portion 119.

Fifth Exemplary Embodiment

Figure 17:
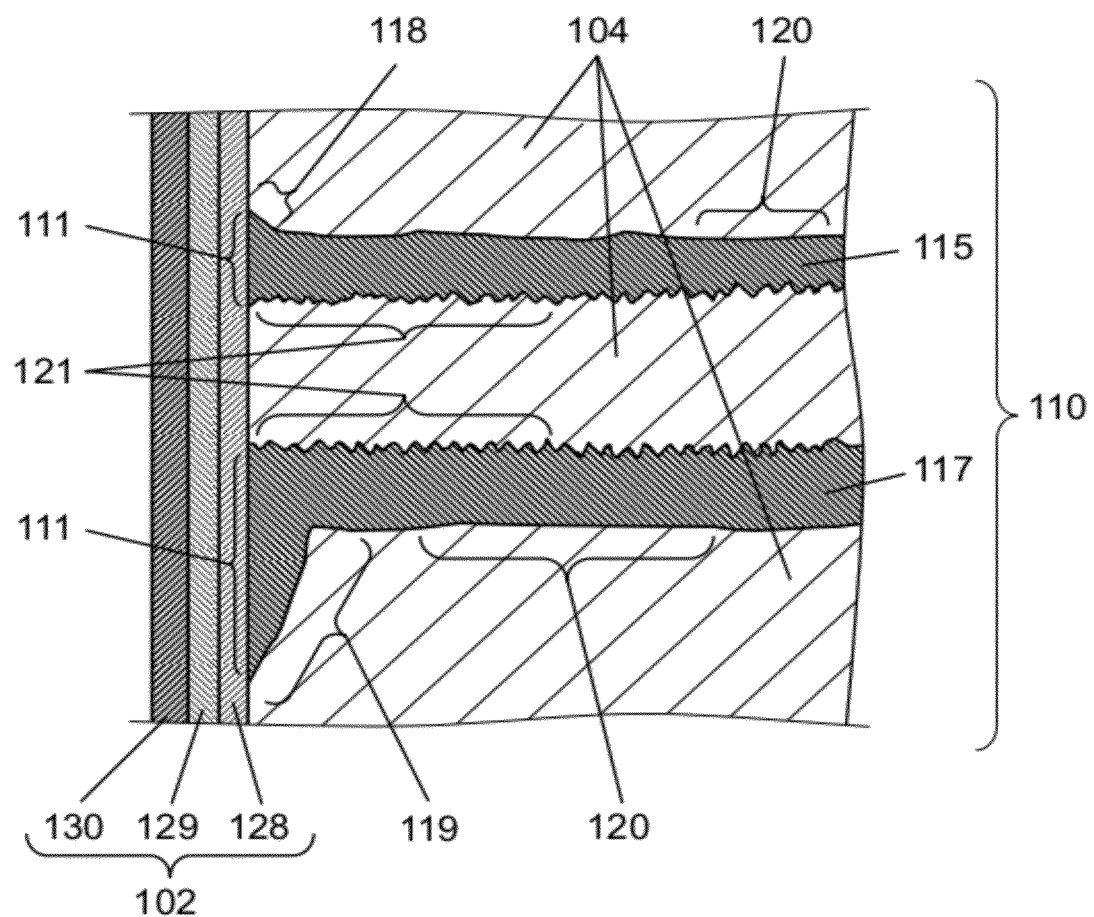
FIG. 17 is a sectional view illustrating a metal film of a module in accordance with a fifth exemplary embodiment of the present invention.

Next, one application example of module 101 (see FIG. 9A) is described with reference to FIG. 17. FIG. 17 is a sectional view illustrating metal film 102 of module 101 in accordance with a fifth exemplary embodiment of the present invention.

In FIG. 17, metal film 102 is composed of base electrode layer 128, copper electrode layer 129, and surface electrode layer 130.

Herein, base electrode layer 128 is provided to enhance adhesiveness with respect to circuit board 110 (for example, a section of an epoxy resin substrate obtained by impregnating glass fiber with an epoxy resin) as a base material. Base electrode layer 128 can be formed of only the same metallic element mainly containing, for example, Ti, Ni, and Cr (desirably any one of Ti, Ni, and Cr is 50 wt % or more). Alternatively, base electrode layer 128 may be formed of a combination (may be an alloy) of one or more elements of Ti, Ni, and Cr, and another metallic element. Ti, Ni, and Cr respectively have a high adhesion force with respect to circuit board 110 (in particular, an epoxy resin as an insulating layer). The thickness of base electrode layer 128 is desirably 0.01 μm or more and 0.50 μm or less. When the thickness is less than 0.01 μm, the adhesiveness with respect to the base material may be deteriorated. Furthermore, when the thickness is more than 0.50 μm, a problem in terms of cost may occur.

Note here that the film thickness of the metal film can be measured by observing a section under a scanning electron microscope (SEM) or by using a metal film thickness tester.

Copper electrode layer 129 is a metal film mainly containing Cu (a metal film containing 90 wt % or more and desirably 95 wt % or more of Cu). This is because when the purity of Cu element included in copper electrode layer 129 is less than 90 wt %, sheet resistance and a shielding property are affected. It is desirable that copper electrode layer 129 have a thickness of 0.1 μm or more and 10.0 μm or less. When copper electrode layer 129 has a thickness of less than 0.1 μm, a necessary shielding effect may not be able to be obtained. When copper electrode layer 129 has a thickness of more than 10.0 μm, it may be affected by residual stress and the like at the time of film formation.

Furthermore, surface electrode layer 130 may be provided if necessary. It is useful that surface electrode layer 130 is allowed to act as, for example, a rust-resistant layer or an antioxidant layer for copper electrode layer 129. For example, it is useful that surface electrode layer 130 is a Ni—Cu alloy. An alloy ratio of Ni—Cu can be adjusted by the alloy ratio of a target set to a sputtering device. When film formation is carried out by using a general magnetron sputtering device, an alloy having a feeble magnetic property (or a nonmagnetic property) including about 65% Ni and 35% Cu is used, a target thickness can be increased, and an effect of reducing exchange frequency of a target can be obtained. The thickness of surface electrode layer 130 is desirably 0.1 μm or more and 1.0 μm or less.

Furthermore, it is desirable that base electrode layer 128, copper electrode layer 129, and surface metal layer 130 be formed continuously by one sputtering device, for example, without interrupting a vacuum state, or without opening a sample to the air during film formation. Surface metal layer 130 may be provided if necessary. A metal film is vapor-deposited by sputtering in one sputtering device (desirably, in one vacuum chamber) by using a plurality of targets. Thus, an increase in a resistance value in the interface with respect to base electrode layer 128 and copper electrode layer 129, and furthermore surface metal layer 130 provided if necessary can be prevented. This is because the formation of an oxidization layer due to exposure to the air can be prevented.

Sixth Exemplary Embodiment

Figure 18:
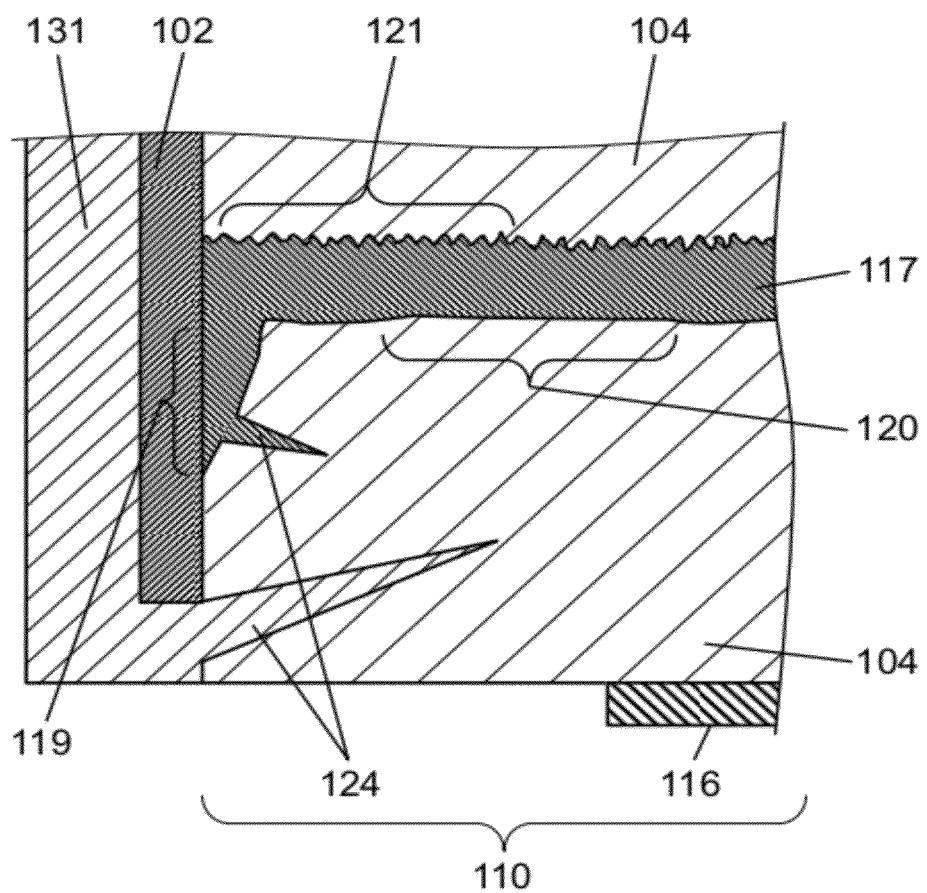
FIG. 18 is a sectional view of a vicinity of a void of a module in accordance with a sixth exemplary embodiment of the present invention.

Next, an application example of module 101 (see FIG. 9A) is described with reference to FIG. 18. FIG. 18 is a sectional view of a vicinity of voids 124 of a module in accordance with a sixth exemplary embodiment of the present invention. A state in which insulating film 131 is further provided on metal film 102 for insulation is described with reference to FIG. 18.

Voids 124 and metal film 102 are covered with insulating film 131. Furthermore, the inside of voids 124 may be filled with insulating film 131. By covering the surfaces of voids 124 with insulating film 131, or filling voids 124 with insulating film 131, a growth of void 124 can be suppressed, and reliability can be improved.

Note here that when curable resin such as a thermosetting resin (for example, an epoxy resin) or a UV curable resin is used as insulating film 131, reliability of circuit board 110 can be enhanced. Furthermore, it is useful that resin having high adhesiveness or affinity with respect to an epoxy resin (for example, a commercially available epoxy thermosetting resin material for coating) is used for insulating film 131. If necessary, it is useful to use a thermosetting resin in which a coloring material or inorganic filler is added for insulating film 131. Furthermore, commercially available solder resist can be used as insulating film 131.

For forming insulating film 131 in such a manner that it covers a part of metal film 102 (furthermore, covers void 124), it is useful to use printing or application (spray, dip, immersion, powder coating) techniques. Furthermore, a resin material (desirably liquid material) constituting insulating film 131 is printed or applied, followed by heating so as to reduce viscosity, so that the inside of void 124 can be impregnated with resin material. Furthermore, when the inside of void 124 is impregnated with a resin material, a vacuum device (or a pressurizing device) is used together. Thus, the inside of void 124 can be impregnated with a resin material.

Furthermore, when the inside of void 124 is filled with a part of insulating film 131, a growth of void 124 (or a crack) can be suppressed.

Industrial Applicability

According to a module and a process for production thereof of the present invention, a module having excellent EMI or EMC property can be achieved, and thus miniaturization of electronic apparatuses, high-density mounting, and, furthermore, narrow-interval mounting can be achieved.

REFERENCE MARKS IN DRAWINGS 101 module
102 metal film
104 epoxy layer (insulating layer)
105 wiring
106 copper foil (ground layer)
107 electronic component
108 mount part 109 sealing part
110 circuit board
111, 111a, 111b exposed part
113 divided unit
114 upper-surface wiring
115 upward inner layer wiring
116 rear-surface wiring
117 downward inner layer wiring
118 first sagging portion
119 second sagging portion
120 glossy surface
121 roughened surface
122 bonding layer
123 dicing groove
124 void
125 glass fiber
126 filler
127 solder resist
128 base electrode layer
129 copper electrode layer
130 surface electrode layer
131 insulating film

The invention claimed is:

1. A module comprising:
a circuit board including an insulating layer and copper foil embedded in the insulating layer;
an electronic component mounted on the circuit board;
a sealing part sealing the electronic component; and
a metal film covering a side surface of the circuit board and a surface of the sealing part;
wherein parts of the copper foil are exposed to the side surface of the circuit board, each of the exposed parts of the copper foil has a width of not less than a thickness of the copper foil and less than 200 μm, and the copper foil and the metal film are electrically coupled to each other through the exposed parts, and
the metal film includes:
a base electrode layer including any one of Ti, Ni, and Cr; and
a copper electrode layer including 90 wt % or more of copper,
wherein the plurality of the exposed parts provided adjacent to each other on the same plane are separated from each other with the distance that is not less than the thickness of the copper foil, and the total of the widths of the exposed part of the copper foil is 20% or more and 75% or less with respect to an entire periphery of the module.

2. The module of claim 1,
wherein two or more layers of the copper foil are formed in such a manner that the exposed parts overlap each other.

3. The module of claim 1,
wherein two or more layers of the copper foil are formed in such a manner that the exposed parts are formed in a staggered state.

4. A module comprising:
a circuit board including:
an insulating layer;
upward inner layer wiring including copper foil whose glossy surface faces upward;
downward inner layer wiring including copper foil whose glossy surface faces downward;
upper-surface wiring; and
rear-surface wiring;
an electronic component mounted on the upper-surface wiring;
a sealing part sealing the electronic component; and
a metal film covering a side surface of the circuit board and a surface of the sealing part,
wherein the upward inner layer wiring is exposed to the lateral surface of the circuit board by exposed parts which include a first sagging portion, and the downward inner layer wiring is exposed to the side surface of the circuit board by exposed parts which include a second sagging portion, and
the metal film includes:
a base electrode layer including any one of Ti, Ni, and Cr; and
a copper electrode layer including 90 wt % or more of copper,
wherein a plurality of the exposed parts of the upward inner layer wiring or the downward inner layer wiring are provided adjacent to each other on the same plane and are separated from each other with a distance that is not less than the thickness of the copper foil, and a total of the widths of the exposed parts of the copper foil of the upward inner layer wiring or the downward inner layer wiring is 20% or more and 75% or less with respect to an entire periphery of the module.

5. The module of claim 4,
wherein the second sagging portion is larger than the first sagging portion.

6. The module of claim 4,
wherein the first sagging portion is provided on the glossy surface of the upward inner layer wiring, and
the second sagging portion is provided on the glossy surface of the downward inner layer wiring.

7. The module of claim 4,
wherein the insulating layer has a void on the lateral surface thereof, and the void is filled with a part of the downward inner layer wiring.

8. The module of claim 7,
wherein the void is provided on a cut surface of the insulating layer between the rear-surface wiring and the downward inner layer wiring of the circuit board.

9. The module of claim 4,
wherein the base electrode layer has a thickness of 0.01 μm or more and 0.50 μm or less, and the copper electrode layer has a thickness of 0.1 μm or more and 10.0 μm or less.

10. The module of claim 9,
wherein a surface electrode layer having a thickness of 0.1 μm or more and 1.0 μm or less is provided on the copper electrode layer.

11. The module of claim 4,
wherein an insulating film is formed on the metal film.

* * * * *